(12) United States Patent
Booth et al.

(10) Patent No.: US 8,164,353 B2
(45) Date of Patent: Apr. 24, 2012

(54) RF-BIASED CAPACITIVELY-COUPLED ELECTROSTATIC (RFB-CCE) PROBE ARRANGEMENT FOR CHARACTERIZING A FILM IN A PLASMA PROCESSING CHAMBER

(75) Inventors: Jean-Paul Booth, Essonne (FR); Luc Albarede, Fremont, CA (US); Jung Kim, Fremont, CA (US); Douglas Keil, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 415 days.

(21) Appl. No.: 12/498,955

(22) Filed: Jul. 7, 2009

(65) Prior Publication Data

US 2010/0007362 A1 Jan. 14, 2010

Related U.S. Application Data

(60) Provisional application No. 61/078,748, filed on Jul. 7, 2008.

(51) Int. Cl.
*G01R 27/26* (2006.01)
*G01R 31/08* (2006.01)
(52) U.S. Cl. .......................... 324/686; 324/522
(58) Field of Classification Search .................. 324/686, 324/658, 649, 600, 715, 713, 522, 76.69, 324/555, 76.11, 762.01; 702/1, 57, 64, 127; 340/660, 664; 361/79, 86, 87
See application file for complete search history.

(56) References Cited

U.S. PATENT DOCUMENTS

| | | | |
|---|---|---|---|
| 4,595,487 | A | 6/1986 | Nunlist |
| 4,963,713 | A | 10/1990 | Horiuchi et al. |
| 4,982,067 | A | 1/1991 | Marantz et al. |
| 5,009,738 | A | 4/1991 | Gruenwald et al. |

(Continued)

FOREIGN PATENT DOCUMENTS

JP 07-037817 A 2/1995

(Continued)

OTHER PUBLICATIONS

"International Preliminary Report on Patentability", Issued in PCT Application No. PCT/US2009/048747; Mailing Date: Jan. 13, 2011.

(Continued)

*Primary Examiner* — Hoai-An D Nguyen
(74) *Attorney, Agent, or Firm* — IPSG, P.C., Intellectual Property Law

(57) ABSTRACT

A method for characterizing deposited film on a substrate within a processing chamber during processing is provided. The method includes determining voltage-current characteristic for a probe head when measuring capacitor is set at a first capacitance value. The method also includes applying RF train to the probe head when measuring capacitor is set at a capacitance value greater than first capacitance value. The method further includes providing an initial resistance value and an initial capacitance value for the deposited film. The method yet also includes employing initial resistance value, initial capacitance value, and voltage-current characteristic to generate simulated voltage-time curve. The method yet further includes determining measured voltage-time curve, which represents potential drop across the deposited film for one RF train. The method more over includes comparing the two curves. If the difference is less than predefined threshold, employ initial resistance value and initial capacitance for characterizing the deposited film.

20 Claims, 18 Drawing Sheets

U.S. PATENT DOCUMENTS

| | | | |
|---|---|---|---|
| 5,175,472 | A | 12/1992 | Johnson, Jr. et al. |
| 5,473,162 | A | 12/1995 | Busch et al. |
| 5,936,413 | A | 8/1999 | Booth et al. |
| 6,024,831 | A | 2/2000 | Hwang et al. |
| 6,165,311 | A | 12/2000 | Collins et al. |
| 6,218,312 | B1 | 4/2001 | Collins et al. |
| 6,291,072 | B1 | 9/2001 | Kimoto et al. |
| 6,440,260 | B1 | 8/2002 | Denda et al. |
| 6,447,691 | B1 | 9/2002 | Denda et al. |
| 6,466,881 | B1 * | 10/2002 | Shih et al. ............... 702/84 |
| 6,833,710 | B2 | 12/2004 | Benveniste |
| 6,842,025 | B2 * | 1/2005 | Gershenzon et al. .... 324/750.19 |
| 6,894,474 | B2 | 5/2005 | Cox et al. |
| 6,902,646 | B2 | 6/2005 | Mahoney et al. |
| 7,067,432 | B2 | 6/2006 | Xu et al. |
| 7,093,560 | B2 | 8/2006 | Tong et al. |
| 7,332,360 | B2 * | 2/2008 | Smayling et al. ............. 438/14 |
| 7,334,477 | B1 | 2/2008 | Pirkle |
| 7,374,636 | B2 | 5/2008 | Horioka et al. |
| 7,413,672 | B1 * | 8/2008 | Keil ............................. 216/59 |
| 7,479,207 | B2 | 1/2009 | Kimball et al. |
| 7,557,591 | B2 * | 7/2009 | Donohue ..................... 324/716 |
| 7,994,794 | B2 | 8/2011 | Kimball et al. |
| 8,004,293 | B2 * | 8/2011 | White et al. ................ 324/713 |
| 2001/0025691 | A1 | 10/2001 | Kanno et al. |
| 2002/0011213 | A1 | 1/2002 | Ramiah et al. |
| 2002/0024338 | A1 | 2/2002 | Saho et al. |
| 2002/0139478 | A1 | 10/2002 | Ma et al. |
| 2003/0038114 | A1 | 2/2003 | Howald |
| 2003/0210510 | A1 | 11/2003 | Hann et al. |
| 2004/0004708 | A1 | 1/2004 | Willis |
| 2005/0032253 | A1 | 2/2005 | Hsu et al. |
| 2005/0103439 | A1 | 5/2005 | Goodman |
| 2005/0211384 | A1 | 9/2005 | Hayashi |
| 2005/0212450 | A1 | 9/2005 | Martinez et al. |
| 2006/0150913 | A1 | 7/2006 | Wang et al. |
| 2007/0080138 | A1 | 4/2007 | Hoffman et al. |
| 2007/0162172 | A1 | 7/2007 | Tanaka et al. |
| 2007/0215285 | A1 | 9/2007 | Kimball et al. |
| 2008/0066861 | A1 | 3/2008 | Kimball et al. |
| 2009/0007642 | A1 | 1/2009 | Busby et al. |
| 2009/0322342 | A1 | 12/2009 | Keil et al. |
| 2010/0006417 | A1 | 1/2010 | Booth et al. |
| 2010/0007337 | A1 | 1/2010 | Booth et al. |
| 2010/0007359 | A1 | 1/2010 | Booth et al. |
| 2010/0008015 | A1 | 1/2010 | Booth et al. |
| 2010/0033195 | A1 | 2/2010 | Booth et al. |

FOREIGN PATENT DOCUMENTS

| | | |
|---|---|---|
| JP | 2001-144071 A | 5/2001 |
| JP | 2008-016517 A | 1/2008 |
| KR | 10-0378187 B1 | 3/2003 |
| KR | 10-2004-0024720 A | 3/2004 |
| KR | 10-2007-0035346 A | 3/2007 |
| KR | 10-2008-0048310 A | 6/2008 |

OTHER PUBLICATIONS

"International Preliminary Report on Patentability", Issued in PCT Application No. PCT/US2009/049756; Mailing Date: Jan. 20, 2011.
"International Preliminary Report on Patentability", Issued in PCT Application No. PCT/US2009/049757; Mailing Date: Jan. 20, 2011.
"International Preliminary Report on Patentability", Issued in PCT Application No. PCT/US2009/049759; Mailing Date: Jan. 20, 2011.
"International Preliminary Report on Patentability", Issued in PCT Application No. PCT/US2009/049760; Mailing Date: Jan. 20, 2011.
"International Preliminary Report on Patentability", Issued in PCT Application No. PCT/US2009/049761; Mailing Date: Jan. 20, 2011.
"International Search Report", Issued in PCT Application No. PCT/US2009/049759; Mailing Date: Feb. 3, 2010.
"Written Opinion", Issued in PCT Application No. PCT/US2009/049759; Mailing Date: Feb. 3, 2010.
"International Search Report", Issued in PCT Application No. PCT/US2009/048747; Mailing Date: Feb. 11, 2010.
"Written Opinion", Issued in PCT Application No. PCT/US2009/048747; Mailing Date: Feb. 11, 2010.
"International Search Report", Issued in PCT Application No. PCT/US2009/049757; Mailing Date: Feb. 23, 2010.
"Written Opinion", Issued in PCT Application No. PCT/US2009/049757: Mailing Date: Feb. 23, 2010.
"International Search Report", Issued in PCT Application No. PCT/US2009/049760; Mailing Date: Feb. 23, 2010.
"Written Opinion", Issued in PCT Application No. PCT/US2009/049760; Mailing Date: Feb. 23, 2010.
"International Search Report", issued in PCT Application No. PCT/US2009/049762; Mailing Date: Feb. 24, 2010.
"Written Opinion", Issued in PCT Application No. PCT/US2009/049762; Mailing Date: Feb. 24, 2010.
"International Search Report", Issued in PCT Application No. PCT/US2009/049756, Mailing Date: Mar. 2, 2010.
"Written Opinion", Issued in PCT Application No. PCT/US2009/049756; Mailing Date: Mar. 2, 2010.
"International Search Report", Issued in PCT Application No. PCT/US2009/049761; Mailing Date: Feb. 24, 2010.
"Written Opinion", Issued in PCT Application No. PCT/US2009/049761; Mailing Date: Feb. 24, 2010.
"Non Final Office Action", U.S. Appl. No. 12/477,007, Mailing Date: Aug. 23, 2011.
"Non Final Office Action", U.S. Appl. No. 12/498,939, Mailing Date: Oct. 20, 2011.
"International Preliminary Report on Patentability", Issued in PCT Application No. PCT/US2009/049762; Mailing Date: Jan. 20, 2011.
"Notice of Allowance", U.S. Appl. No. 12/498,934, Mailing Date: Nov. 28, 2011.
"Non Final Office Action", U.S. Appl. No. 12/498,940, Mailing Date: Dec. 7, 2011.

* cited by examiner $$\left\{ \begin{array}{l} C_{film} \dfrac{dV_{film}}{dt} = I_0 \left[ 1 - \alpha \left( V_x + V_{film} - V_f \right) - \exp\left( \dfrac{(V_{film} + V_x - V_f)}{T_e} \right) \right] - \dfrac{V_{film}}{R_{film}} \\[2ex] C_{pif} \dfrac{dV_x}{dt} = I_0 \left[ 1 - \alpha \left( V_x + V_{film} - V_f \right) - \exp\left( \dfrac{(V_{film} + V_x - V_f)}{T_e} \right) \right] \end{array} \right.$$

Where $\alpha$ is the slope of the linear part of the curve, $V_x$ is the potential measured by the electronic box, $V_{film}$ is the potential of the layer, $V_f$ is the floating potential

FIG. 5

$$C_{film} = \frac{\varepsilon_o \varepsilon_r A}{d} \qquad \text{Eq. 7A-1}$$

$$\frac{d}{\varepsilon_r} = \frac{\varepsilon_o A}{C_{film}} \qquad \text{Eq. 7A-2}$$

FIG. 7A $$R_{film} = \rho \frac{d}{A} \qquad \text{Eq. 7B-1}$$

$$\rho \varepsilon_r = \frac{\varepsilon_r R_{film} A}{d} \qquad \text{Eq. 7B-2}$$

$$\rho \varepsilon_r = \frac{R_{film} \, C_{film}}{\varepsilon_o} \qquad \text{Eq. 7B-3}$$

FIG. 7B

RF-BIASED CAPACITIVELY-COUPLED ELECTROSTATIC (RFB-CCE) PROBE ARRANGEMENT FOR CHARACTERIZING A FILM IN A PLASMA PROCESSING CHAMBER

PRIORITY CLAIM

This application is related to and claims priority under 35 U.S.C. §119(e) to a commonly assigned provisional patent application entitled "RF-Biased Capacitively-Coupled Electrostatic (CCE) Probe Arrangement For Characterizing A Film In A Plasma Processing Chamber," by Booth et al., Application Ser. No. 61/078,748, filed on Jul. 7, 2008, which is incorporated by reference herein.

BACKGROUND OF THE INVENTION

During the processing of a substrate in the plasma processing chamber, satisfactory results often require tight control of the process parameters. This is particularly true for processes such as deposition, etching, cleaning, etc., that are employed to manufacture modern high density integrated circuits. When the processing parameters (such as bias voltage, RF power, ion flux, plasma density, pressure, etc.) exceed a narrow, pre-defined window, a process excursion is said to have occurred. These process excursions represent undesirable events that often lead to undesirable processing results (e.g., poor etch profile, low selectivity, etc.). Accordingly, the detection, characterization, and avoidance of process excursions are important tasks for process engineers in the manufacture of integrated circuits.

Detecting process excursions is often performed via monitoring of various process parameters. Some process parameters (such as bias voltage, reflected power, etc.) may be measured directly while others may be inferred from measured parameters.

During a plasma process, such as a plasma etch process for example, polymer deposition often occurs. This polymer deposition results in a layer of film deposited on component surfaces in the chamber. The deposited film affects subsequent etch processes, increases the possibility of particulate contamination, and necessitates frequent chamber cleaning. Further, if a sufficiently thick deposition layer is present in the chamber, the sensor head may be covered with polymer, resulting in erroneous values for the sensor signal. In other processes, the film deposition may be intentional yet would affect sensor reading the same way.

Accordingly, the characterization of the deposited film on the chamber surface is desirable for the purpose of tool control, diagnostic and/or recipe adjustment in order to improve process results and process yield, as well as to avoid damage to the substrate and/or the chamber components.

BRIEF SUMMARY OF THE INVENTION

The invention relates, in an embodiment, to a method for characterizing a deposited film on a substrate within a processing chamber of a plasma processing system during substrate processing. The method includes determining a voltage-current characteristic for a probe head, wherein a measuring capacitor is set at a first capacitance value. The method also includes applying a radio frequency (RF) train to the probe head, thereby causing the measuring capacitor to be charged, wherein the measuring capacitor is set at a second capacitance value, the second capacitance value being greater than the first capacitance value. The method further includes providing an initial resistance value for the deposited film and an initial capacitance value for the deposited film. The method yet also includes employing the initial resistance value, the initial capacitance value, and the voltage-current characteristic to generate a first simulated voltage-time curve. The method yet further includes determining a first measured voltage-time curve, the first measured voltage-time curve representing a potential drop across the deposited film for one RF train. The method more over includes comparing the first simulated voltage-time curve to the first measured voltage-time curve, wherein if a difference between the first simulated voltage-time curve and the first measured voltage-time curve is less than a predefined threshold, employing the initial resistance value and the initial capacitance for characterizing the deposited film.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

An example RFB-CCE probe arrangement is shown in FIG. 1 herein.

Figure 3:
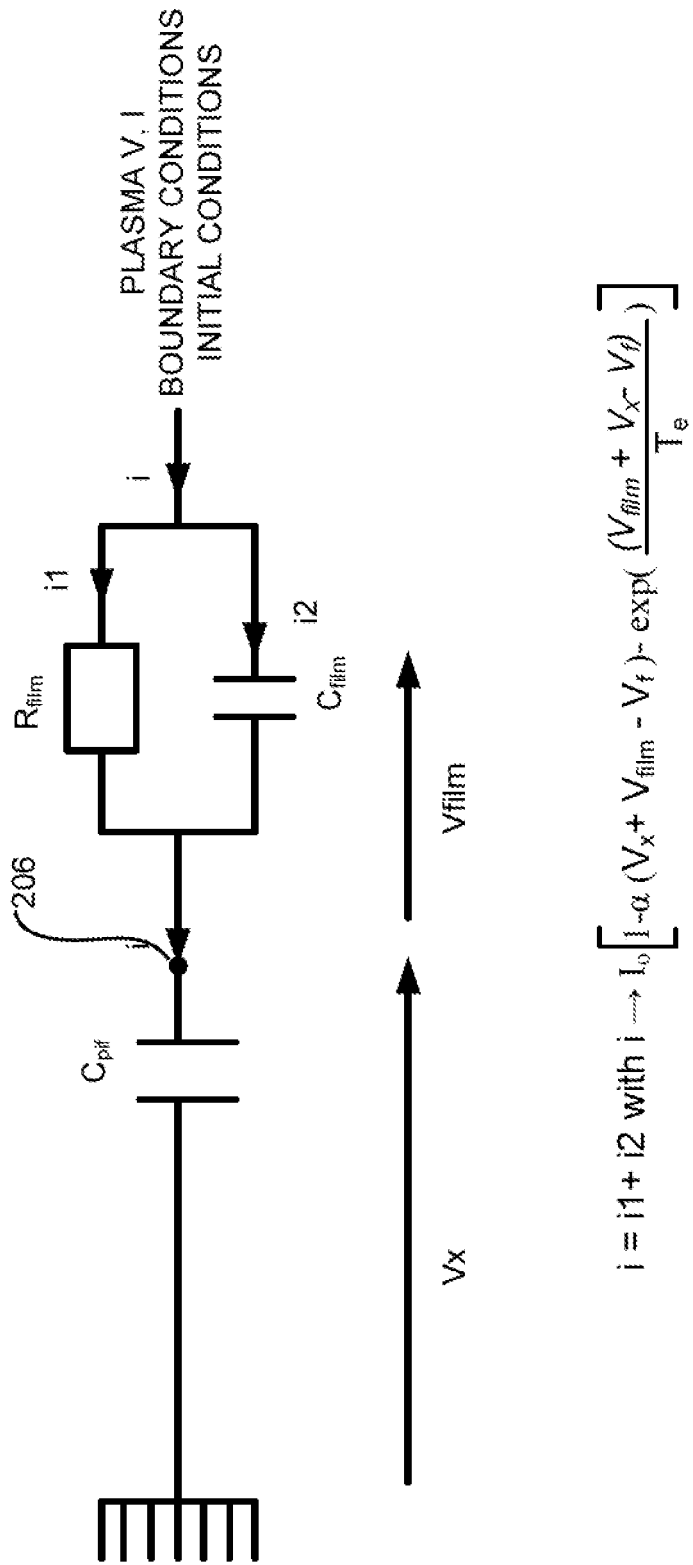

The equivalent circuit is shown in FIG. 3

Figure 4:
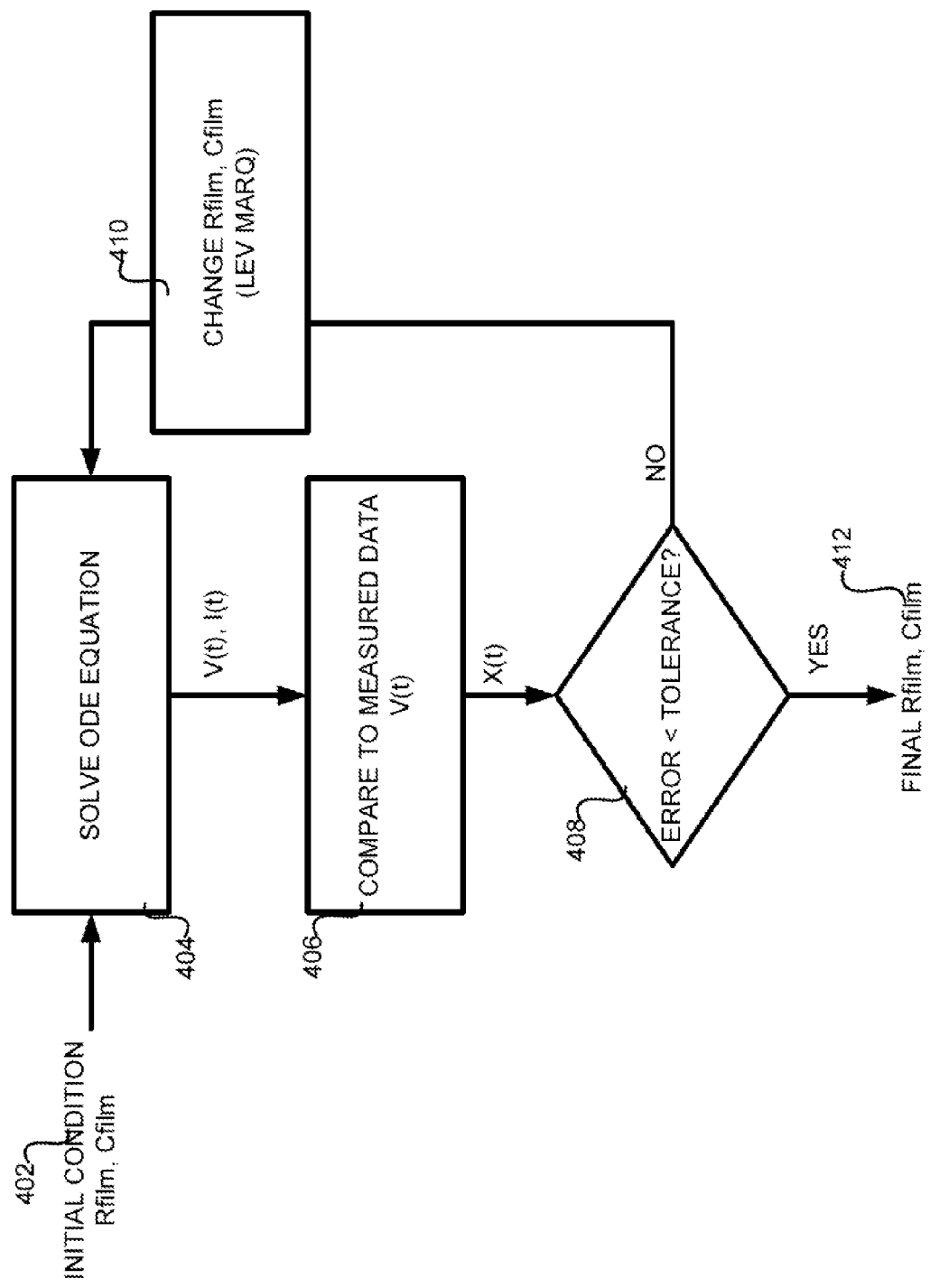

FIG. 4 shows, in accordance with an embodiment of the invention, an iterative technique for calculating $R_{film}$ and $C_{film}$.

FIG. 5 shows the simultaneous differential equations for solving $R_{film}$ and $C_{film}$.

Figure 6:
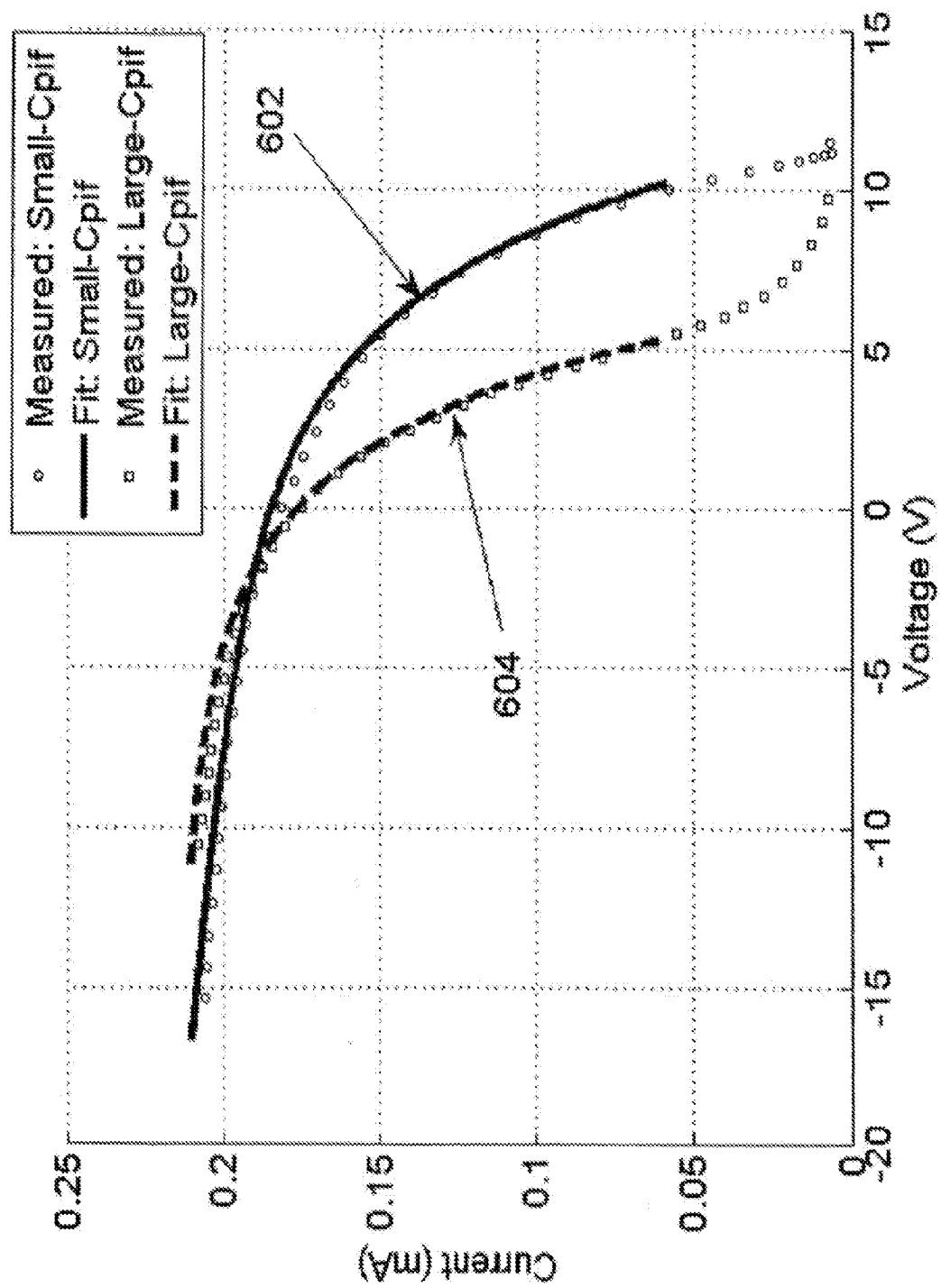

FIG. 6 shows a characteristic V-I characteristic curve for a small capacitor value for Cm and an observed VI curve for a larger capacitance value (e.g., 100 nF and higher).

FIG. 7A shows, in accordance with an embodiment of the invention, the relative relationship between $C_{film}$ from and the thickness (d) of the film.

FIG. 7B shows, in accordance with an embodiment of the invention, the calculation for the resistance value for $R_{film}$.

Figure 8:
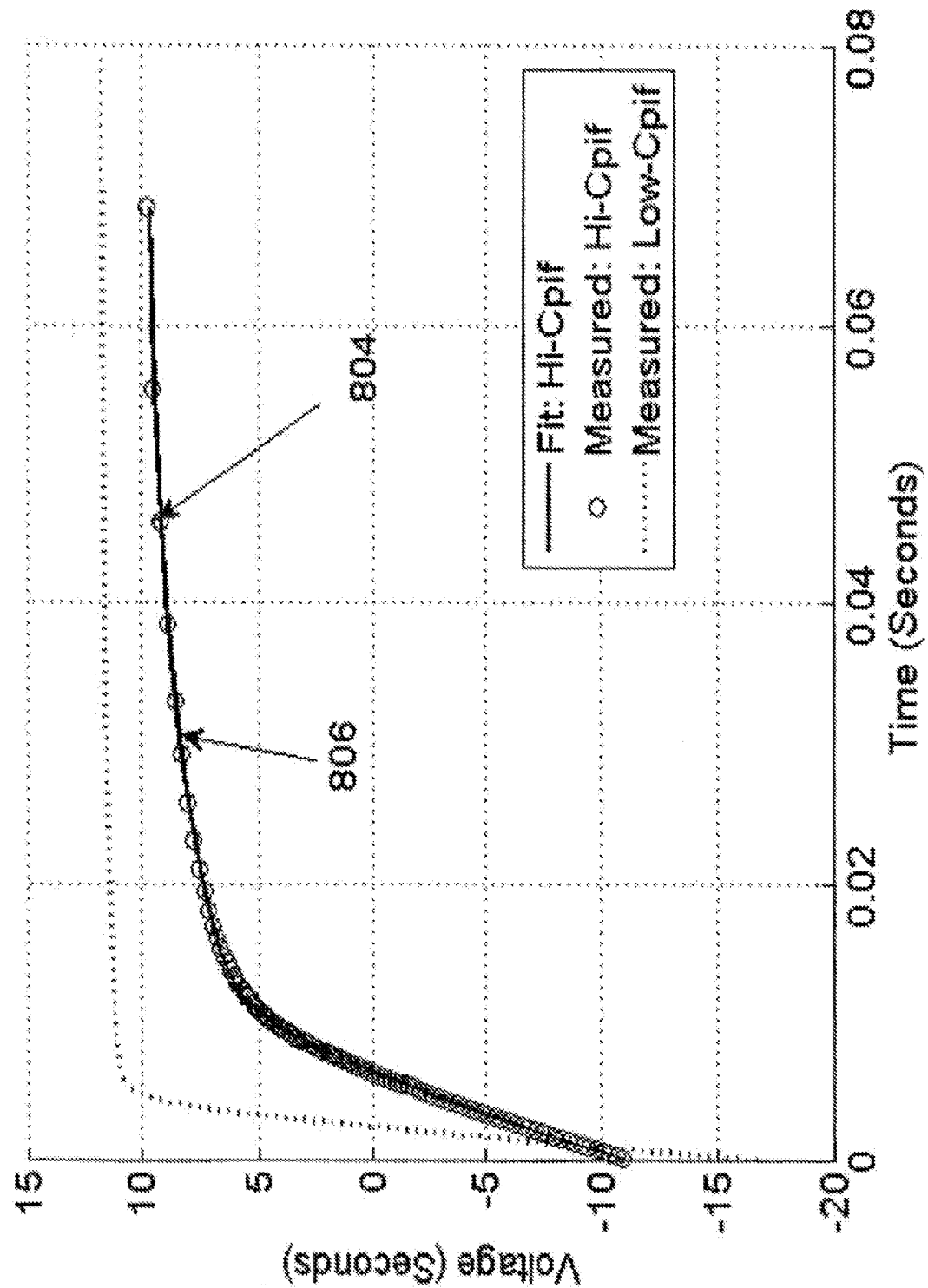

FIG. 8 shows a modeled V(t) curve.

Figure 9:
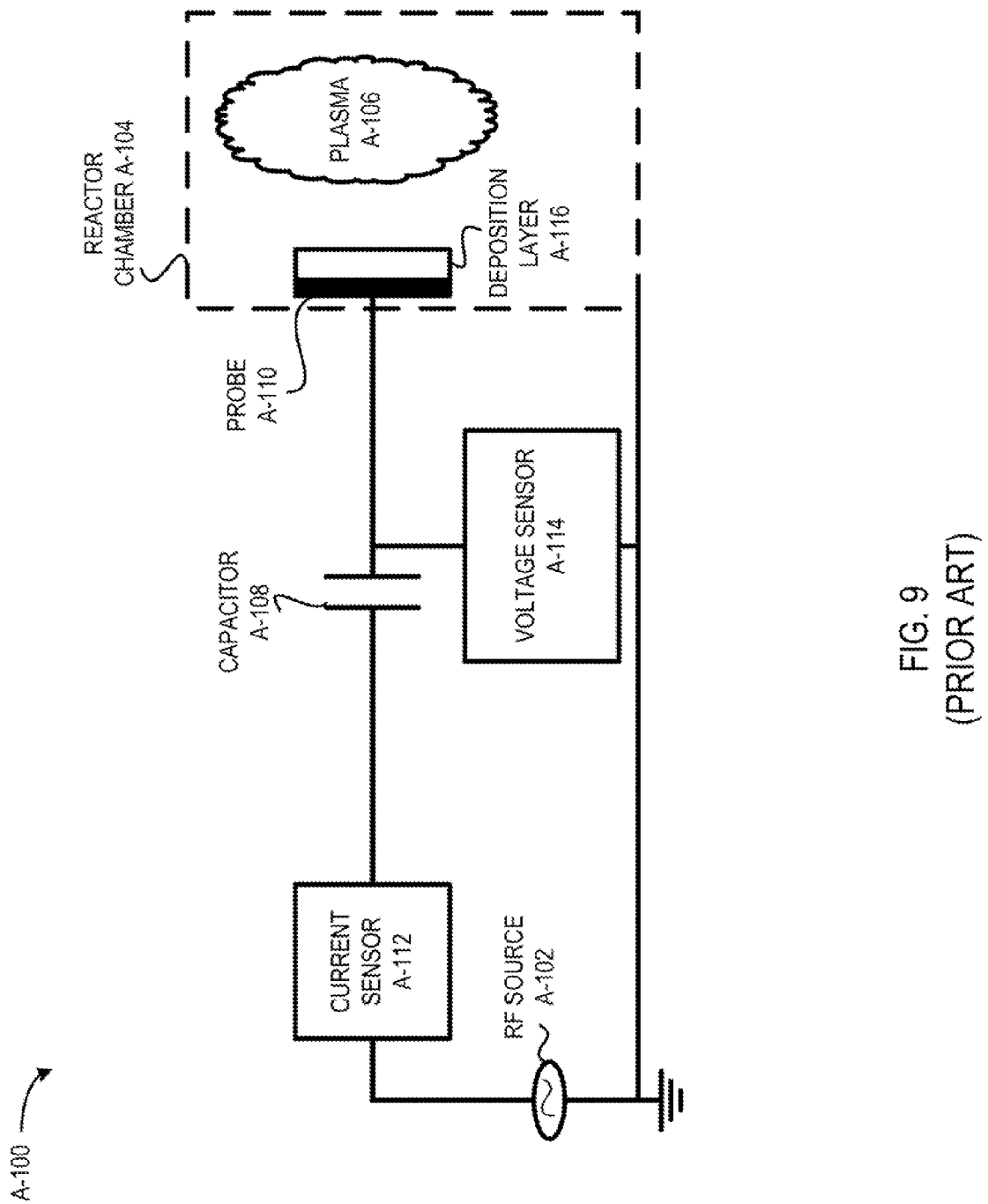

FIG. 9 of the DISCUSSION shows a simple schematic diagram of a portion of a plasma system with a radio frequency (RF) source capacitively-coupled to a reactor chamber to produce plasma.

Figure 10:
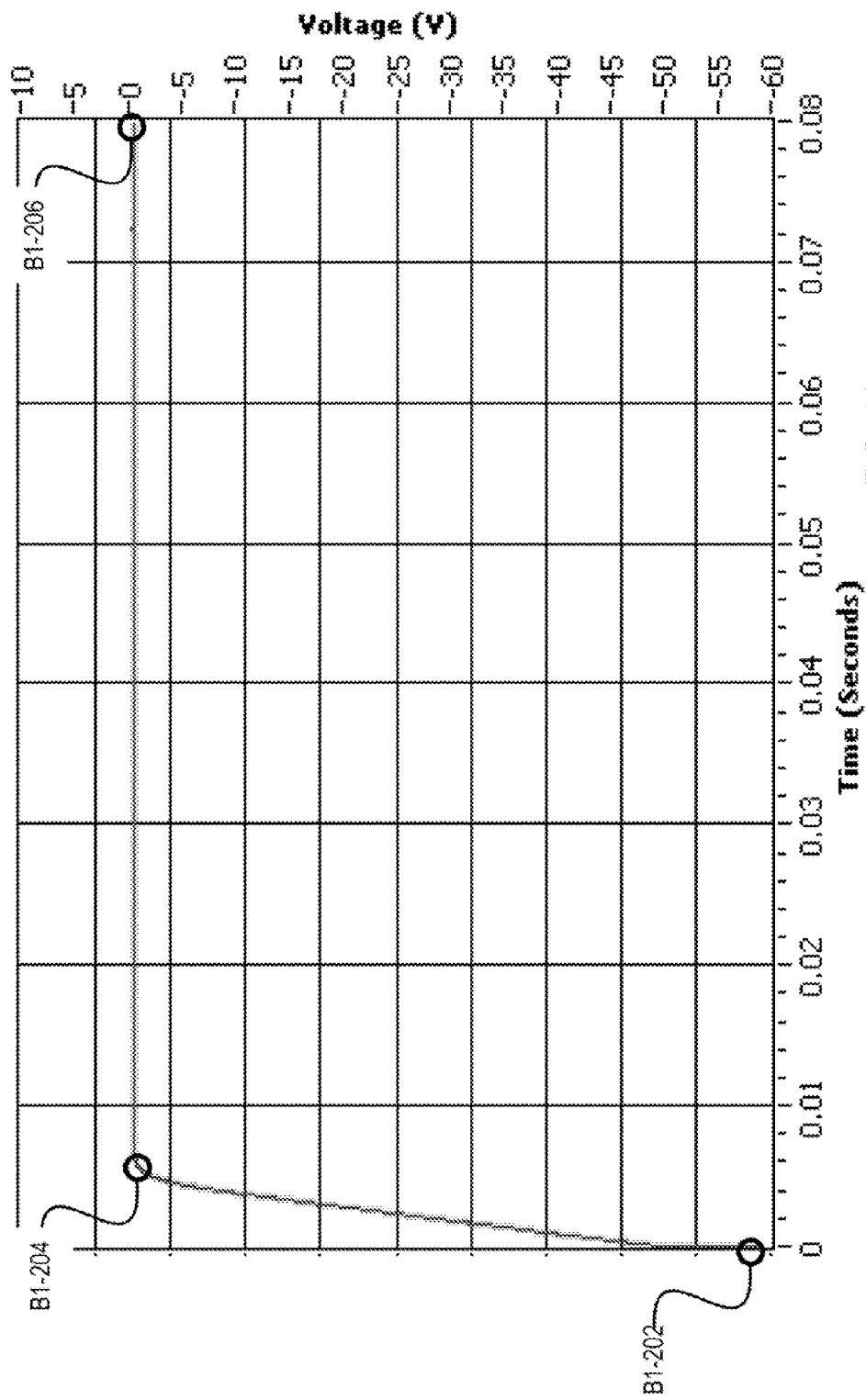

FIG. 10 of the DISCUSSION shows a graph of voltage versus time after a RF charge.

Figure 11:
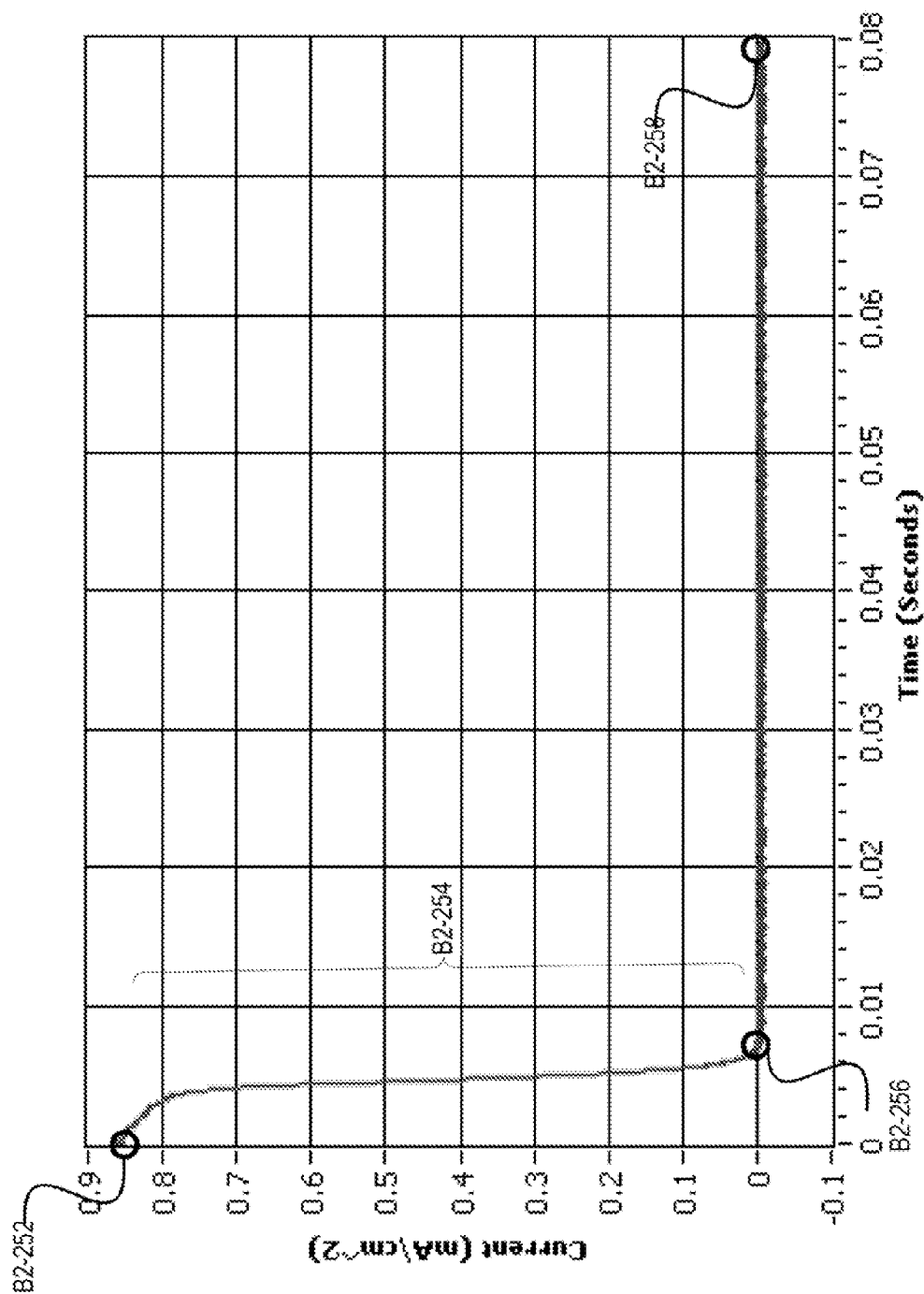

FIG. 11 of the DISCUSSION shows a graph of current data collected after a RF charge.

Figure 12:
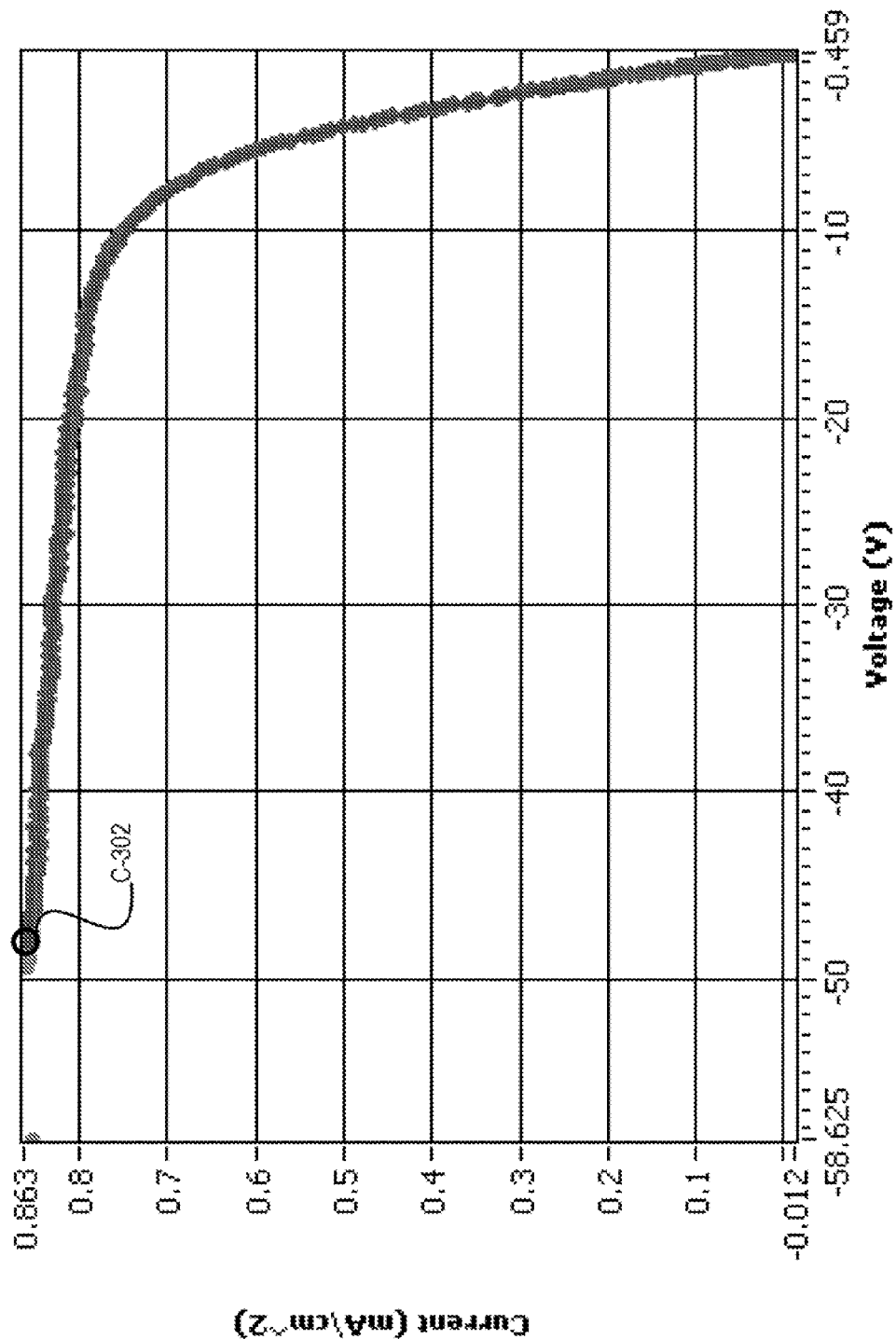

FIG. 12 of the DISCUSSION shows a simple current versus voltage graph for a single time interval between a RF burst.

Figure 13:
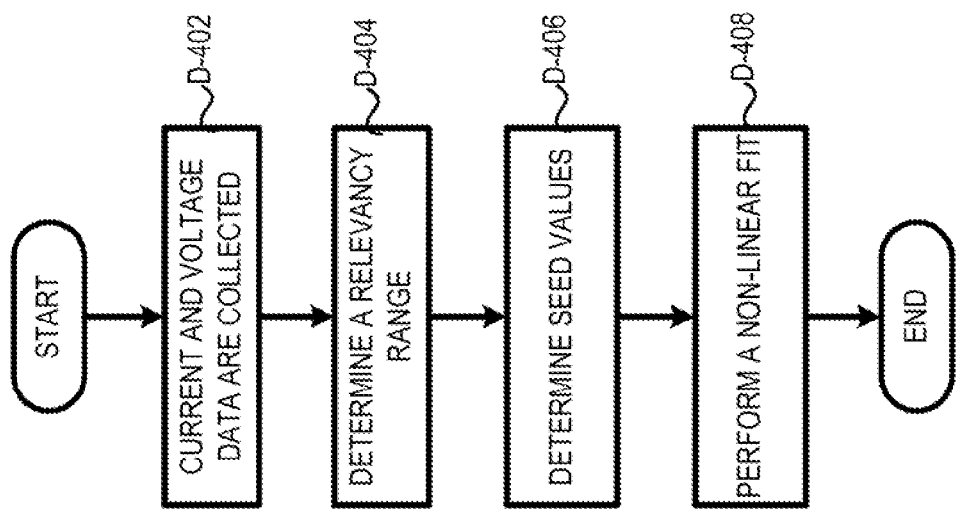

FIG. 13 of the DISCUSSION shows, in an embodiment of the invention, a simple flow chart illustrating the overall steps for automatically characterizing plasma during substrate processing.

Figure 14:
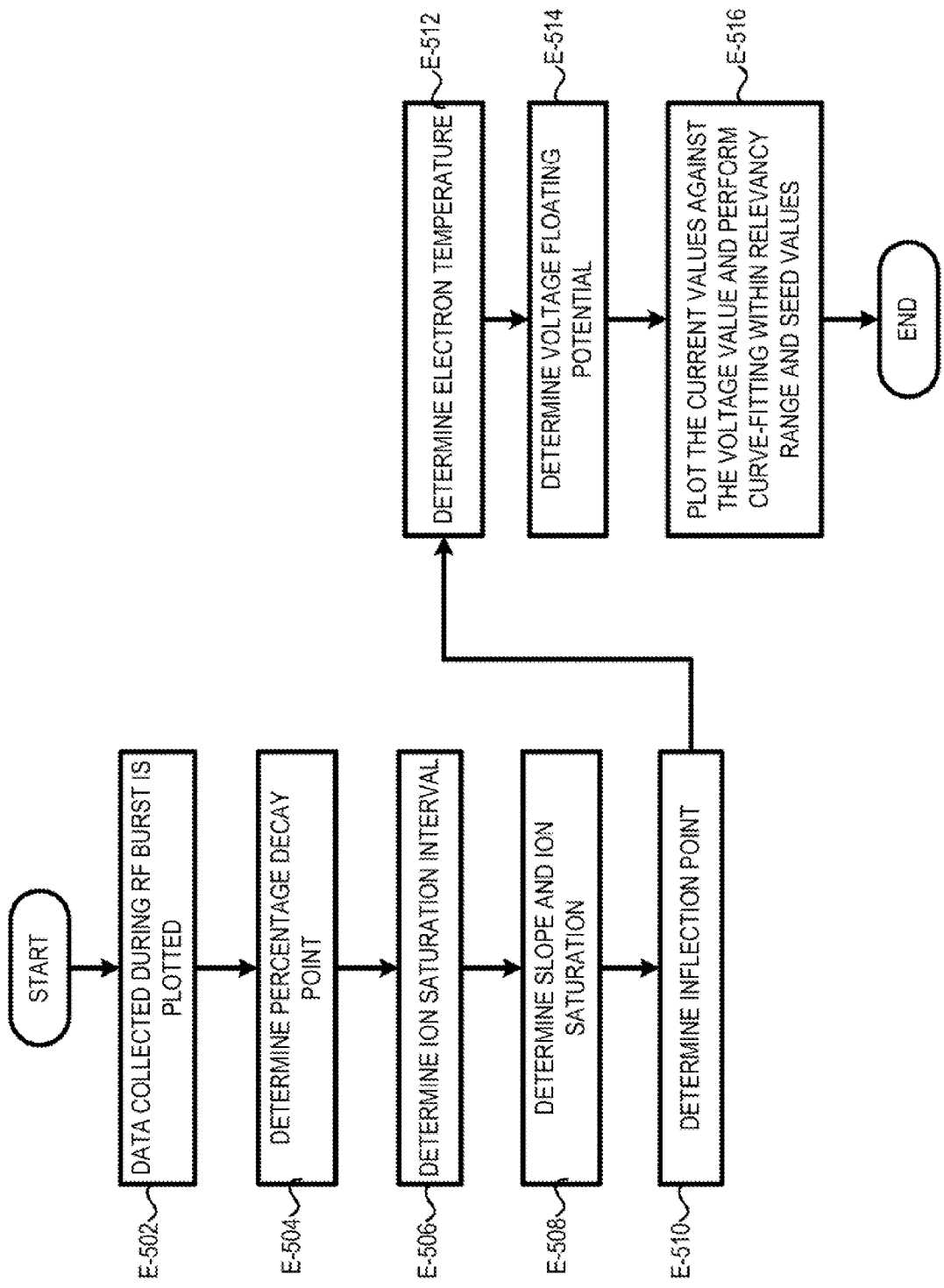

FIG. 14 of the DISCUSSION shows, in an embodiment of the invention, a simple algorithm for determining the relevancy range and the seed values.

Figure 15:
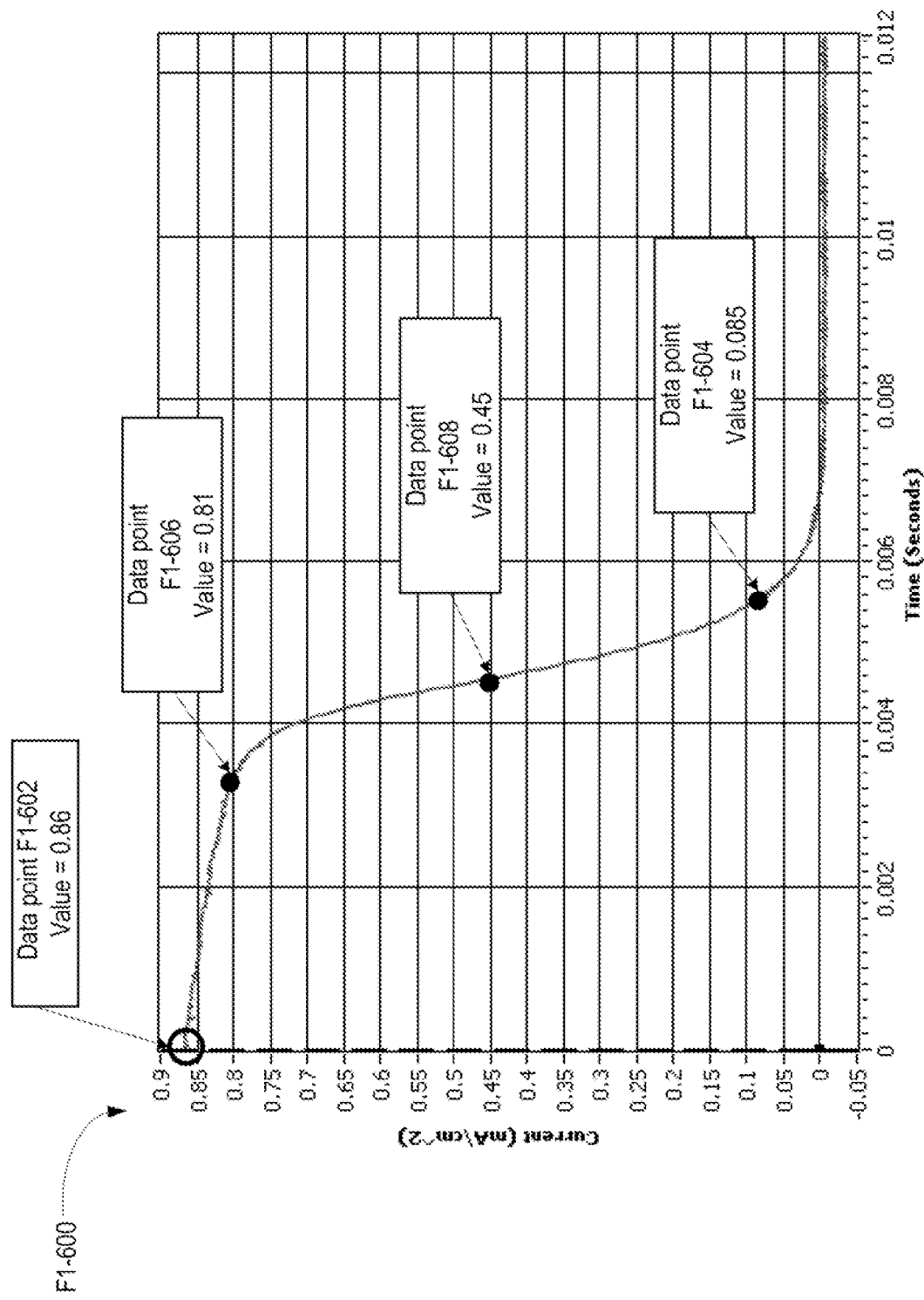

FIG. 15 of the DISCUSSION shows an example of current versus time after a RF burst.

Figure 16:
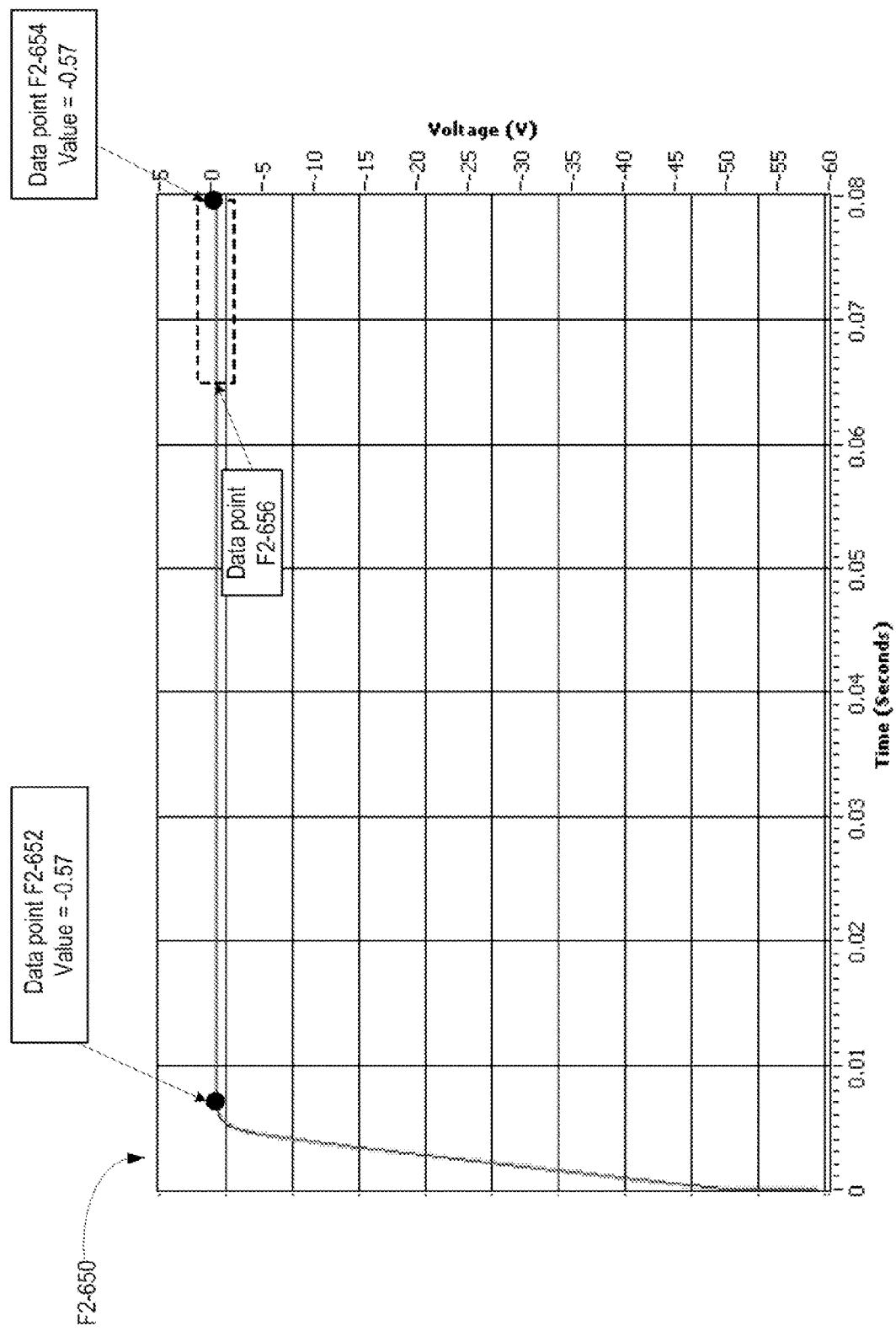

FIG. 16 of the DISCUSSION shows an example of voltage versus time after a RF burst.

Figure 17:
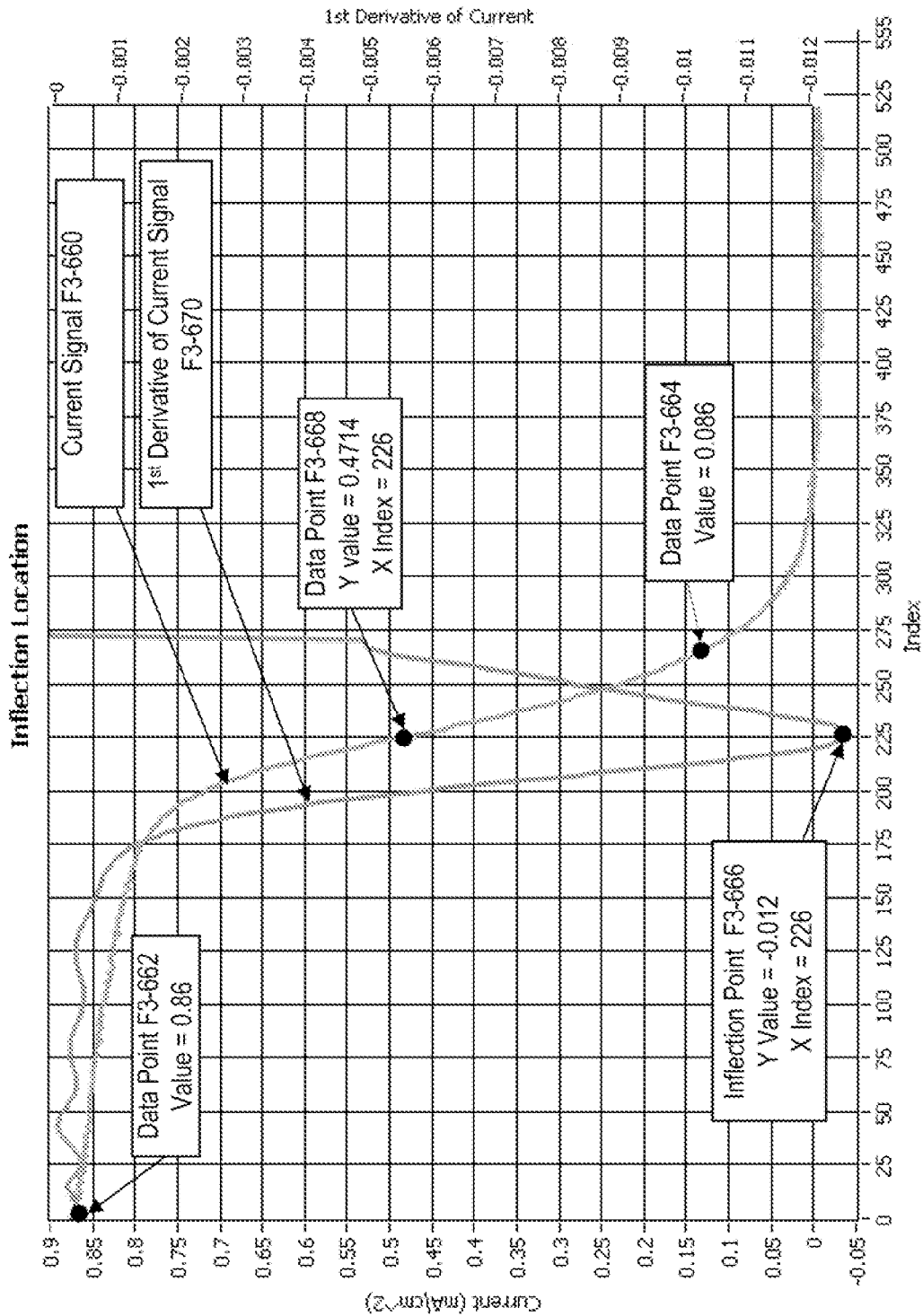

FIG. 17 of the DISCUSSION shows an example of an inflection point.

Figure 18:
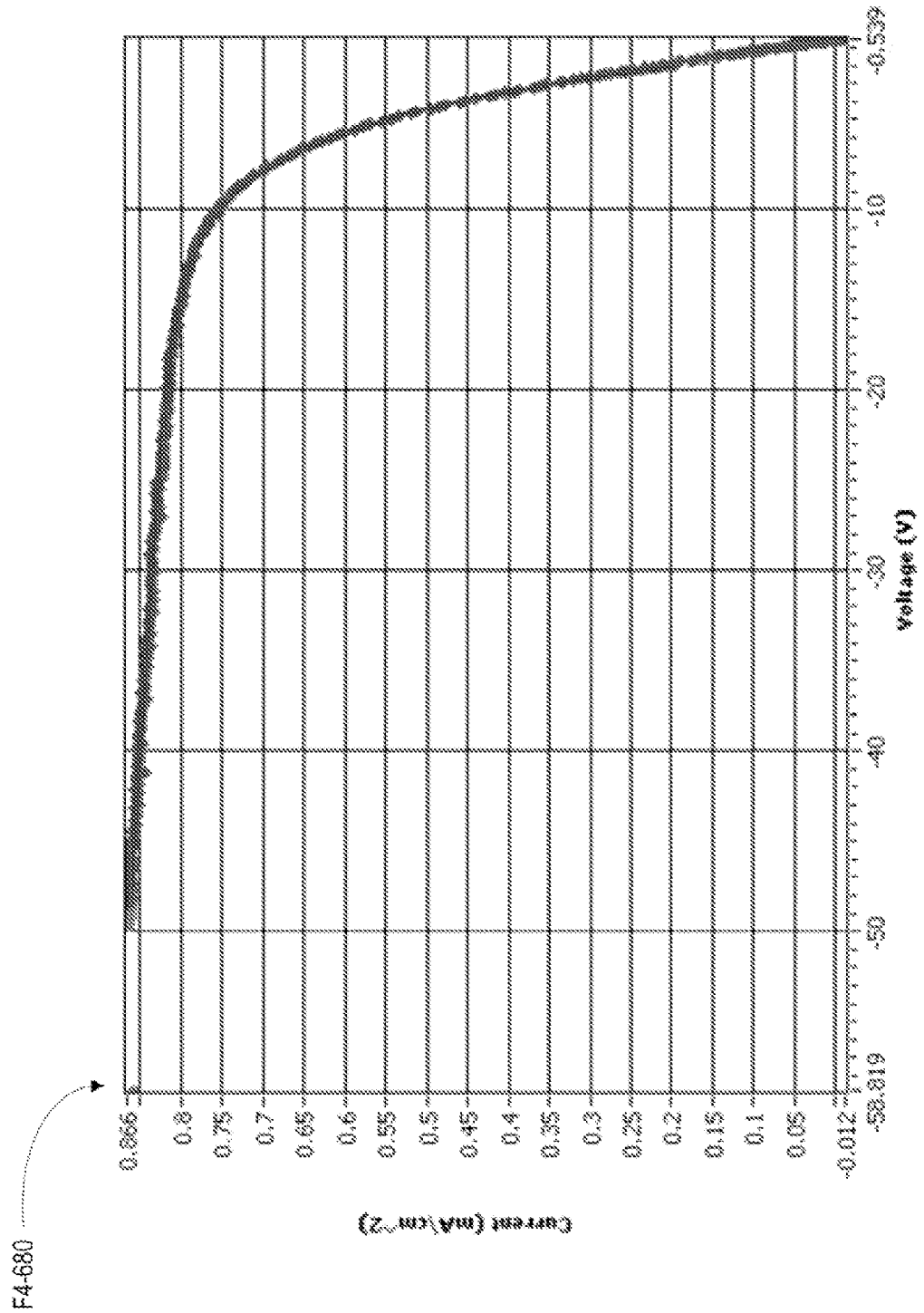

FIG. 18 of the DISCUSSION shows an example of a curve-fitting applied to a current versus voltage graph.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the invention relate to the use of a RF-biased capacitively-coupled electrostatic (RFB-CCE) probe arrangement to characterize the deposited film in a plasma processing chamber. By way of background, RFB-CCE probes have long been employed to measure plasma processing parameters such as ion flux, electron temperature, floating potential, thin film thickness, etc. RFB-CCE probes are known in the art, and details may be obtained from publicly available literature, including for example U.S. Pat. No. 5,936,413 entitled "Method And Device For Measuring An Ion Flow In A Plasma" (Aug. 10, 1999), which is incorporated herein by reference.

RFB-CCE probes offer many advantages, including for example improved detection sensitivity, minimal perturbation to the plasma due to the small size of the sensor, ease of mounting on the chamber wall, relative insensitivity to polymer deposition on the sensor head in some circumstances, etc. Furthermore, the plasma-facing surface of the sensor can often be made of the same material as that of the surrounding chamber wall, thereby further minimizing perturbation to the plasma. These advantages make RFB-CCE probes highly desirable for use in sensing process parameters.

Generally speaking, a RFB-CCE probe arrangement involves a plasma-facing sensor connected to one plate of a measuring capacitor. The other plate of the measuring capacitor is coupled to an RF voltage source. The RF voltage source periodically supplies RF oscillation trains, and measurements are performed across the measuring capacitor to determine the rate of capacitor current discharge immediately following the end of each RF oscillation train. Details pertaining to the RFB-CCE probe arrangement and RFB-CCE probe operation are discussed in the aforementioned U.S. Pat. No. 5,936,413 and will not be further discussed herein.

The inventors herein realize that the sensor current signal (which reflects the current across the measurement capacitor in between RF oscillation trains) is relatively insensitive to the thickness of the deposited film on the sensor head when the measurement capacitor has a relatively small capacitance value. However, the inventors also realized that the sensor current signal is affected to a greater degree by film thickness if the measurement capacitor has a relatively large capacitance value. From these observations, methods and arrangements for characterizing the deposited film are formulated and disclosed herein.

In accordance with one or more embodiments of the present invention, innovative methods and arrangements using a RFB-CCE probe are provided to characterize the thickness and quality of the deposited film on the probe sensor head. In one or more embodiments, a switchable measurement capacitor arrangement is provided whereby a smaller capacitance value is employed for the measurement capacitor when insensitivity to deposited film thickness is desired. RFB-CCE probe operation when the measurement capacitor has a relatively small capacitance value yields probe V-I characteristics, which can be used to determine the ion saturation current, the floating potential and the electron temperature. The probe V-I characteristics may be employed subsequently to assist in the calculation of the film's capacitance and the film's resistance using sensor parameters obtained when the measurement capacitor has a larger value. Thus, one or more embodiments of the invention relate to techniques for deriving the film's capacitance and the film's resistance from RFB-CCE probe readings.

Figure 1:
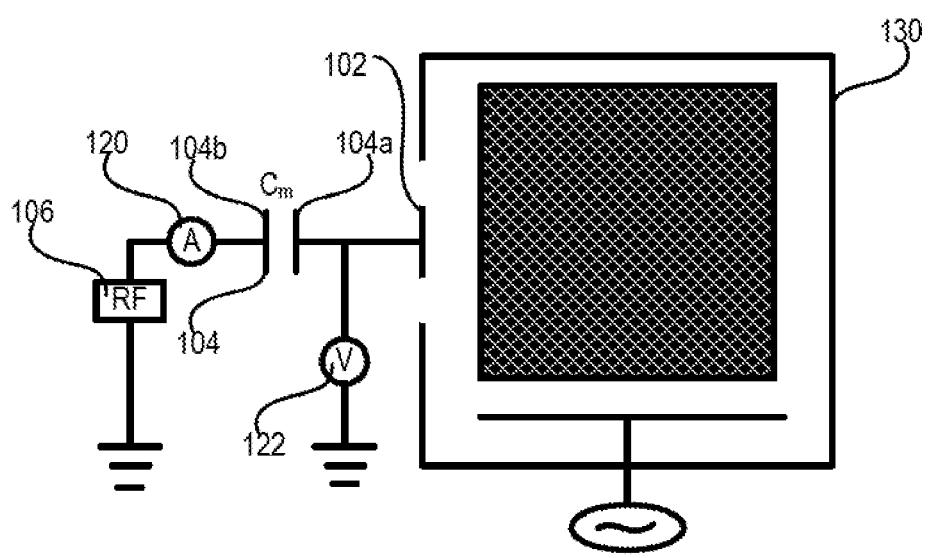

The features and advantages of embodiments of the present invention may be better understood with reference to the figures and discussions that follow. In general terms, a RFB-CCE probe arrangement involves a plasma-facing sensor connected to one terminal of a measuring capacitor. An example RFB-CCE probe arrangement is shown in FIG. 1 herein. In FIG. 1, plasma facing sensor 102 (which is disposed in a wall of chamber 130 and is substantially co-planar with the chamber wall) is coupled to one plate 104a of measuring capacitor 104. The other plate 104b of the measuring capacitor 104 is coupled to an RF voltage source 106. The RF voltage source 106 periodically supplies RF oscillation trains and measurements are performed across the measuring capacitor to determine the rate of capacitor current discharge in between RF oscillation trains. A current measurement device 120 is disposed in series between measuring capacitor 104 and RF voltage source 106 to detect the capacitor current discharge rate. Alternatively or additionally, a voltage measurement device 122 is coupled between plate 104a and ground to measure the potential of the probe head. Details pertaining to the RFB-CCE probe arrangement and RFB-CCE probe operation are discussed in the aforementioned U.S. Pat. No. 5,936,413 and will not be further discussed herein.

As mentioned, a probe head made of a conductive material is installed in a surface of the chamber. A short RF train is applied to the probe, causing the capacitor (Cm) to charge up and the surface of the probe to acquire a negative potential (several tens of volts negative with respect to ground). Following the end of the RF pulse, the potential of the probe decays back to the floating potential as Cm discharges. The rate at which the potential changes is determined by the plasma characteristics. During this discharge, the potential of the probe Vf is measured with high impedance voltage measuring device 122, and the current following to the probe and through capacitor Cm is measured with the current measuring device 120. The curves V(t) and I(t), where in t is time, are used to construct a current-voltage characteristic, V-I, which is then analyzed by a signal processor. Further details may be found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477,007), which is included in the DISCUSSION herein.

Figure 2:
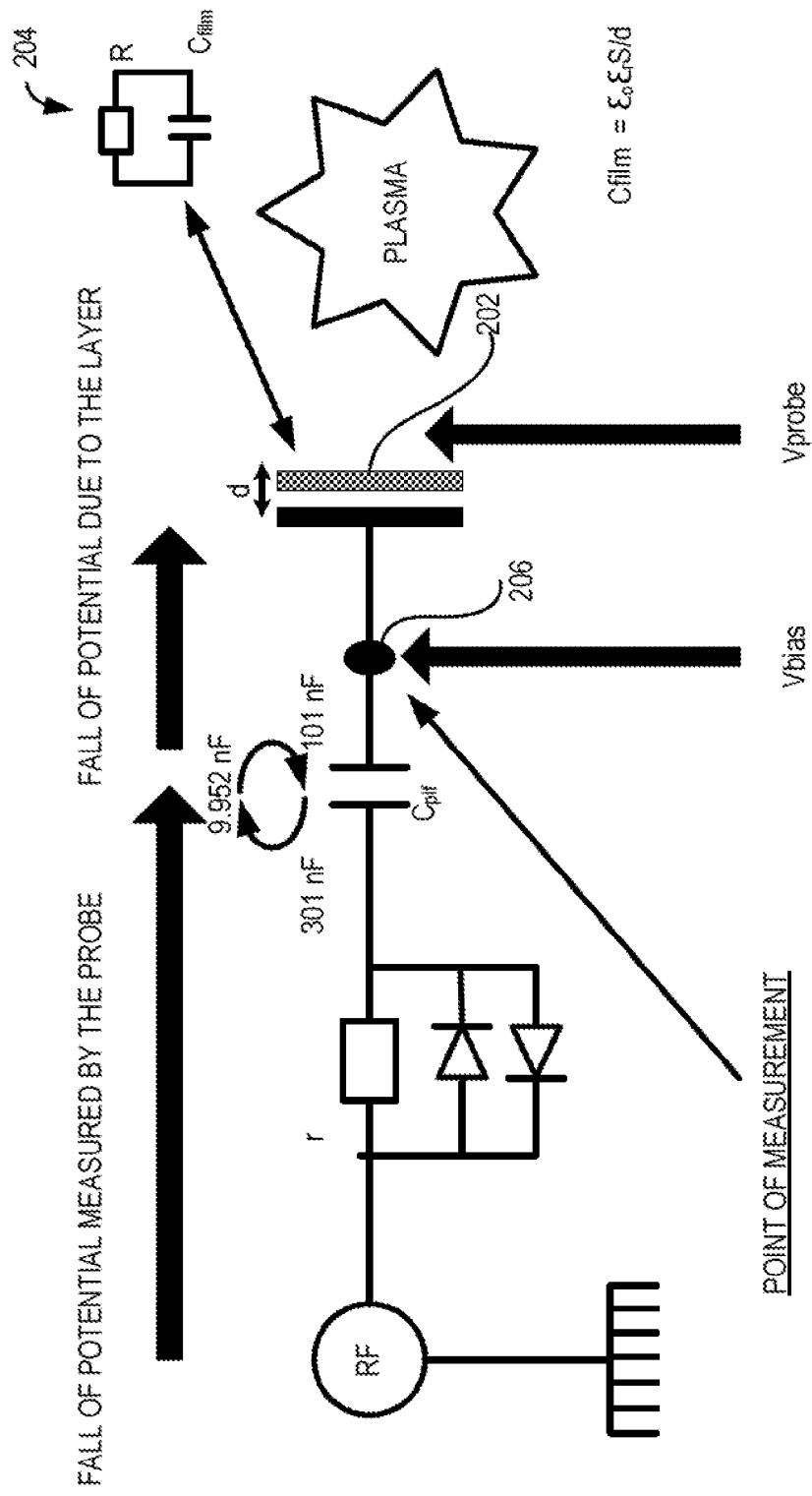
FIG. 2 shows, in accordance with an embodiment of the invention, a circuit model of a RFB-CCE probe arrangement, including a model of the deposited film.

FIG. 2 shows, in accordance with an embodiment of the invention, a circuit model of a RFB-CCE probe arrangement, including a model of the deposited film 202. Since the deposited film is typically some type of polymer and is typically an imperfect dielectric, there is typically leakage current and the film may be modeled by an RC circuit (reference 204)

whereby the resistor $R_{film}$ is parallel with the capacitor $C_{film}$. The resistance value of $R_{film}$ relates to the resistance across the film, which in turn relates to the chemical composition of the deposited film. The capacitance value of $C_{film}$ relates to the thickness of the film and its relative dielectric permittivity $\in_r$. $C_M$ in FIG. 2 represents the measurement capacitor, which is charged by the RF source. The presence of the deposited film results in a potential drop between point 206 and the plasma-facing surface of film 202.

The equivalent circuit is shown in FIG. 3 wherein $V_x$ is the voltage drop between the measurement point 206 and ground and $V_{film}$ is the voltage drop across the film with respect to point 206. $V_{film}$ cannot be directly measured but may be deduced from the RC model as will be discussed herein.

In an embodiment, a relatively small capacitance value (e.g. between 1 to 50 nF in an embodiment) is initially employed for the measurement capacitor Cm (see FIG. 3). In this case, the decay sensor current and voltage signals following each RF excitation train are relatively unaffected by the film thickness. With the small capacitor value for Cm, the V-I characteristic curve for the CCE probe may be obtained, as seen in curve 602 in FIG. 6. This VI curve is then fitted to the function $I=I_0[1-\alpha(V-V_f)-\exp(((V-V_f)/T_e)$ to obtain values of the ion saturation current, Io, the electron temperature, Te, the floating potential, $V_f$, and the slope of the linear part of the I-V curve, $\alpha$. Further details regarding tire VI characteristic curve may be obtained in the aforementioned patent application No. 61/075,948.

Subsequently, a larger capacitance value (e.g., 100 nF and higher) may be employed for Cm in order to facilitate the calculation of $R_{film}$ and $C_{film}$. In this case the observed VI curve is distorted, as seen in curve 604 of FIG. 6. FIG. 4 shows, in accordance with an embodiment of the invention, an iterative technique for calculating $R_{film}$ and $C_{film}$.

In step 402, an initial guess for $R_{film}$ and $C_{film}$ is provided. The initial guess may represent, for example, an educated guess based on experience, based on theory, or based on other empirical data. In step 404, the initial values for $R_{film}$ and $C_{film}$ are employed to solve the simultaneous differential equations of FIG. 5, in combination with the values $I_o$, $T_e$, $V_f$ and $\alpha$ determined previously with a small value of Cm, to generate a simulated voltage-time curve, $V_s(t)$.

There exist many mathematical techniques for solving the simultaneous differential equations of FIG. 5, including using a software known as Matlab, by The Math Works. Inc. of Natick, Mass.

The result is a simulated curve of voltage versus time, Vs(t). This modeled V(t) curve is shown in FIG. 8 as curve 806. FIG. 8 also shows curve 804, representing experimentally measured values for V(t), which is voltage versus time measured at point 206 of FIG. 2 for a single excitation oscillation train. The difference is ascertained (step 406) and compared to a threshold in step 408. If the error is less than a predefined threshold, the value of $R_{film}$ and $C_{film}$ are employed to characterize the film (412). On the other hand, if the error is greater the predefined threshold, a Levenberg-Marquardt non-linear least square curve fitting algorithm is employed to refine the value for $R_{film}$ and $C_{film}$ (410).

The new $R_{film}$ and $C_{film}$ values are fed back into step 404 to execute iteration through the steps of FIG. 4. The steps of FIG. 4 are executed iteratively until the error is below the predefined threshold (see step 408) at which point the value $R_{film}$ and $C_{film}$ are deemed acceptable for characterizing the deposited film.

FIG. 7A shows, in accordance with an embodiment of the invention, the relative relationship between $C_{film}$ from and the thickness (d) of the film. As can be seen in FIG. 7A, the capacitance value $C_{film}$ is equal to the product of $\in_0$ and $\in_r$ and A divided by d, where d represents the film thickness, $\in_r$ represents the relative permittivity of the dielectric material that comprises the film, A represents the surface area of the probe sensor head, and $\in_0$ represents the permittivity of free space. See Equation 7A-1. By algebraic manipulation, the ratio of $d/\in_r$ is equal to the product of $\in_0$ and A divided by the capacitance value $C_{film}$. Since the capacitance value $C_{film}$ can be ascertained (see above), and the surface area of the probe sensor head (A) as well as the permittivity of free space $\in_0$ is known, the ratio of $d/\in_r$ can be readily determined. See Equation 7A-2.

Further, the value for $\in_r$ (relative permittivity for the film) can be provided by a process engineer who has some knowledge of the film or by measuring the film capacitances and by independently measuring film thickness. The thickness of the film may be measured using any technique, including for example ellipsometry. Once the value for $\in_r$ (relative permittivity for the film) can be ascertained, that value for $\in_r$ (relative permittivity for the film) can be can be used to find the thickness d for any particular capacitance value $C_{film}$ for any particular probe sensor with probe sensor head area A.

FIG. 7B shows, in accordance with an embodiment of the invention, the calculation for the resistance value for $R_{film}$. As can be seen in FIG. 7B, the value for $R_{film}$ equals the resistivity for the film p times the distance (d) and divided by the cross-area of the probe head A. See Equation 7B-1. Multiplying both sides of the equation by the permittivity of free space $\in_0$ yields the next equation. See Equation 7B-2. Substituting the inverse of the ratio of $d/\in_r$ from Equation 7A-2 yields Equation 7B-3, wherein the product of the resistivity for the film $\rho$ times the value for $\in_r$ (relative permittivity for the film) equals the product of resistance value $R_{film}$ and capacitance value $C_{film}$ divided by the permittivity of free space $\in_0$. Since the resistance value $R_{film}$, capacitance value $C_{film}$, and the permittivity of free space $\in_0$ are known, and the relative permittivity for the film $\in_r$ can be provided, the resistivity for the film can be determined, which reflects the chemical makeup of the film.

In an embodiment, a switchable capacitor arrangement is provided with multiple capacitors, each having a different value. In this manner, the RFB-CCE probe may be running with a smaller value for the measurement capacitor to render the sensor reading relatively insensitivity to film thickness. Occasionally, a larger capacitor may be switched in to facilitate the calculation for $R_{film}$ and $C_{film}$. In an embodiment, the values for $R_{film}$ and $C_{film}$ obtained while a larger capacitance value is used for the measurement capacitor are then employed to calculate the effect of film thickness on the measurement of the V-I curve. The $R_{film}$ and $C_{film}$ values may then be employed to correct, for the presence of the film, the measurement of the plasma parameters (e.g., $I_0$, Te, Vf) such that the measured values reflect those that would have been measured with a clean probe.

In another embodiment, the value of $R_{film}$ and $C_{film}$ may be employed to inform the operator or the tool controller module of the thickness and resistivity of the film that is intentionally deposited during a processing step for process control purposes. By positioning the sensor head close to the substrate, it is possible to ascertain with some degree of accuracy the thickness and quality of film being deposited on the substrate, for example.

As can be appreciated from the foregoing, embodiments of the invention provide methods and arrangements for calculating the quality and thickness of the deposited film. These calculated resistance and capacitance value ($R_{film}$ and $C_{film}$) may then be employed to improve the accuracy of the sensor readings as the film builds up over time on the sensor probe head surface, or may be employed alternatively or additionally to characterize the film for process control purposes or maintenance purposes. With the use of the RFB-CCE probe, there is minimal perturbation to the plasma since the RFB-CCE probe head tends to be small, to be installed flushed with the surrounding plasma-facing structures of the plasma processing chamber, and may have a plasma-facing probe surface formed of the same material as that of the plasma-facing components of the chamber.

While this invention has been described in terms of several preferred embodiments, there are alterations, permutations, and equivalents, which fall within the scope of this invention. For example, although the iterative calculation method employing non-linear least square curve fitting algorithm is employed to calculate $R_{film}$ and $C_{film}$, an approximation technique may be employed to determine the value of $R_{film}$ and $C_{film}$ from the V(t) curves of FIG. 5 if desired. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

The DISCUSSION is also found in a co-pending application entitled "Methods for Automatically Characterizing a Plasma", filed Jun. 26, 2008 in the US Patent Office (Application No. 61/075,948) and filed Jun. 2, 2009 in the US Patent Office (application Ser. No. 12/477,007) and are incorporated by reference herein.

Discussion of Methods for Automatically Characterizing a Plasma

Advances in plasma processing have provided for growth in the semiconductor industry. To supply chips for a typical electronic product, hundreds or thousands of substrates (such as semiconductor wafers) may be processed. In order for the manufacturing company to be competitive, the manufacturing company needs to be able to process the substrates into quality semiconductor devices with minimal processing time.

Typically, during plasma processing, problems may arise that may cause the substrates to be negatively impacted. One important factor that may alter the quality of the substrate being processed is the plasma itself. In order to have sufficient data to analyze the plasma, sensors may be employed to collect processing data about each substrate. The data collected may be analyzed in order to determine the cause of the problems.

To facilitate discussion, FIG. 9 shows a simple schematic diagram of a data collecting probe in a portion of a plasma system A-100. Plasma system A-100 may include a radio frequency (RF) source A-102, such as a pulsating RF frequency generator, capacitively-coupled to a reactor chamber A-104 to produce plasma A-106. When RF source A-102 is turn on, a bias voltage is developed across an external capacitor A-108, which may be about 26.2 nanofarads (nF). In an example, RF source A-102 may provide a small burst of power (e.g., 11.5 megahertz) every few milliseconds (e.g., about five milliseconds) causing external capacitor A-108 to be charged. When RF source A-102 is turned off, a bias voltage remains on external capacitor A-108 with a polarity such that probe A-110 is biased to collect ions. As the bias voltage decays, the curves as shown in FIGS. 10, 11 and 12 may be traced.

Those skilled in the art are aware that probe A-110 is usually an electrical probe with a conducting planar surface that may be positioned against the wall of reactor chamber A-104. Probe A-110 is thus directly exposed to reactor chamber A-104 environment. Current and voltage data collected by probe A-110 may be analyzed. Since certain recipe may cause a non-conducting deposition layer A-116 to be deposited on probe A-110, not all probes may be able to collect reliable measurements. However, those skilled in the art are aware that a PIF (planar ion flux) probe enables data to be collected despite the non-conducting deposition layer since the PIF probe scheme is not required to draw a direct current (DC) to implement a measurement.

The current and voltage signal in plasma system A-100 is measured by other sensors. In example, when RF source A-102 is switched off, current sensor A-112 and a high impedance voltage sensor A-114, are employed to measure the current and the voltage, respectively. The measurement data collected from current sensor A-112 and voltage sensor A-114 may then be plotted to create a current graph and a voltage graph. The data may be manually plotted or the data may be entered into a software program to create the graphs.

FIG. 10 shows a graph of voltage versus time after a RF charge cycle. At data point B1-202, RF source A-102 has been switched off after an RF charge has been provided (i.e., RF burst). In this example, at data point B1-202, the voltage across probe A-110 is about negative 57 volts. As plasma system A-100 returns to a rest state (interval between data points B1-204 and B1-206), the voltage usually reaches a floating voltage potential. In this example, the floating voltage potential rises from about negative 57 volts to about zero volt. However, the floating voltage potential does not have to be zero and may be a negative or a positive bias voltage potential.

Similarly, FIG. 11 shows a graph of current data collected after a RF charge. At data point B2-252, RF source A-102 has been switched off after an RF charge has been provided. During a decay period B2-254, the return current at external capacitor A-108 may be discharged. In an example, at full charge (data point B2-252), the current is about 0.86 mA/cm². However, when the current is fully discharged (data point B2-256), the current has returned to zero. Based on the graph, the discharge takes about 75 milliseconds. From data point B2-256 to data point B2-258, the capacitor remains discharged.

Since both the current data and the voltage data are collected over a period of time, a current versus voltage graph may be generated by coordinating the time in order to eliminate the time variable. In other words, the current data collected may be matched against the voltage data collected. FIG. 12 shows a simple current versus voltage graph for a single time interval between a RF burst. At data point C-302, RF source A-102 has been switched off after an RF charge has been provided.

By applying a non-linear fit to the data collected during each RF burst, plasma A-106 may be characterized, hi other words, parameters (e.g., ion saturation, ion saturation slope, election temperature, floating voltage potential, and the like) that may characterize plasma A-106 may be determined. Although plasma A-106 may be characterized with the data collected, the process of calculating the parameters is a tedious manual process that requires human intervention. In an example, when the data has been collected after each RF burst (i.e., when the RF charge has been provided and then turned off), the data may be fed into a software analysis program. The software analysis program may perform a non-linear fit to determine the parameters that may characterize the plasma. By characterizing the plasma, the engineer may be able to determine how a recipe may be adjusted in order to minimize substandard processing of the substrates.

Unfortunately, the prior art method of analyzing the data for each RF burst may require several seconds or as much as several minutes to complete. Since there are typically thousands, if not millions of RF bursts to analyze, the total time for characterizing the plasma for a recipe may take hours to calculate. As a result, the prior art method is not an effective method in providing timely relevant data for process control purposes.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, the PIF probe method may be employed to collect data about the plasma that may be positioned within the reactor chamber environment. Data collected from a sensor (e.g., PIF probe) may be employed to characterize the plasma in the reactor chamber. Additionally, since the sensor employs a collection surface as shown in FIG. 9, data about the chamber surface may also be determined. In the prior art, the data collected by the PSD probe provides a ready source of data that is available for analysis. Unfortunately, the sheer volume of data that may be collected has made analyzing the data in a timely manner a challenge. Since thousands or even millions of data points may be collected, the task of identifying the relevant interval in order to accurately characterize a plasma may be a daunting task, especially since the data is usually being analyzed manually. As a result, the data collected has not been useful in providing the plasma processing system with a timely characterization of the plasma.

However, if relevant data points that are needed in order to characterize a plasma are identified from the thousands/millions of data points that may be collected, then the time required to characterize a plasma may be significantly reduced. In accordance with embodiments of the invention, a method is provided for automatically characterizing plasma in a relatively short time period. Embodiments of the invention described herein provide for an algorithm for identifying the relevancy range in order to reduce the data points that may need to be analyzed in order to characterize a plasma. As discussed herein, the relevancy range refers to a smaller set of data points from the thousands or millions of data points that may be gathered between each RF burst. Embodiments of the invention further provide for estimating seed values that may be applied to a mathematical model that calculates the values for characterizing a plasma. By performing curve-fitting to the relevancy range, parameters that may be employed to characterize a plasma may be calculated.

The features and advantages of the present invention may be better understood with reference to the figures and discussions that follow.

FIG. 13 shows, in an embodiment of the invention, a simple flow chart illustrating the steps for automatically characterizing plasma during substrate processing. Consider the situation wherein, an RF charge has been provided during substrate processing.

At a first step D-402, current and voltage data are collected. In an example, after the RF source has been turned on, an RF charge (pulse) is provided. After the RF charge has been turn off, a current sensor and a voltage sensor may be employed to collect data at a probe, such as a planar ion flux probe, which may be mounted to a chamber wall of the reactor chamber. As aforementioned, the number of data points that may be collected by the sensors may range in the thousands or millions. In some cases, thousands to ten of thousands of data points may be collected between each RF burst making near-real-time analysis in the prior art nearly impossible.

In the prior art, several hours may be allotted for analyzing the measurement data that is collected during semiconductor substrate processing. In one aspect of the invention, the inventors herein realized that the measurement data between each RF burst does not have to be analyzed in order to characterize a plasma. Instead, if curve-fitting is applied to a relevancy range of the data set, parameters that may be employed to characterize the plasma may be determined.

At a next step D-404, a relevancy range is determined. As aforementioned, the relevancy range refers to a subset of the data set that has been collected between each RF burst. In the prior art, since the data is being manually analyzed, the sheer volume of the data collected make calculating the relevancy range a challenging task. In many instances, the relevancy range may be visually estimated. In identifying the relevancy range, noises that may exist may be substantially eliminated from the subset of data set. In an example, during complex substrate processing, a polymer buildup may occur on the probe, causing a portion of the data collected to be skewed. For example, the portion of the data that may be impacted tends to be the data that may be collected once the capacitor has been fully discharged. In identifying the relevancy range, data associated with the polymer buildup may be removed from the analysis. In other words, the determination of the relevancy range may enable plasma characterization to occur without being subject to random noises. Discussion about how a relevancy range may be determined, for an example, is provided later in the discussion of FIG. 14.

In addition to identifying the relevancy range, the seed values may also be determined, at a next step D-406. As discussed herein, the seed values refer to the estimated value of the slope, the electron temperature, the ion saturation value, the floating voltage potential, and the like. Discussion about how the seed values may be estimated, for example, is provided in the discussion of FIG. 14.

The relevance range and the seed values are utilized to perform curve-fitting. Since curve-fitting has to be performed before the next RF burst, the methods employed to determine the relevancy range and/or seed values have to utilize minimum overhead and produce values that are close to the final fit values, thereby reducing number of curve-fitting iterations that may be required in order to achieve a rapid convergence.

With the relevancy range and the seed values, at a next step D-408, a non-linear fit (e.g., curve-fitting) may be performed, thereby enabling the plasma to be characterized within a shorter time period without requiring an expensive high-end computer. Unlike the prior art, the method allows for results from a decay interval due to a single RF burst to be characterized in approximately 20 milliseconds instead of requiring a few minutes or even a few hours to process. With near-realtime analysis capability, the method may be applied as part of an automatic control system to provide the engineer with relevant data during plasma processing.

FIG. 14 shows, in an embodiment of the invention, a simple algorithm for determining the relevancy range and the seed values. FIG. 14 will be discussed in relation to FIGS. 15, 16, 17, and 18.

At a first step E-502, the data collected during each RF burst is automatically plotted. In an example, the current data that may be collected by the current sensor is plotted into a current versus time graph F1-600, such as the one shown in FIG. 15. In another example, the voltage data collected may be plotted into a voltage versus time graph F2-650, as shown in FIG. 16. Although the data may produce similar graphs as the prior art, unlike the prior art, the data collected is automatically fed into the analysis program without requiring human intervention. Alternatively, the measurement data collected does not have to be plotted. Instead, the data may be fed directly into the analysis program. Instead, the graphs are provided as visual examples to explain the algorithm.

Unlike the prior art, the entire data set is not analyzed in order to characterize a plasma. Instead, a relevancy range is determined. To determine the relevancy range, a percentage decay point may first be determined, at a next step E-504. As discussed herein, the percentage decay point refers to the data point at which the original value has decayed to a certain percentage of the original value. In an embodiment, the percentage decay point may represent the end of the data interval to be analyzed, in an example, when the RF source is switched off, the current value is about 0.86 mA/cm². The value is represented by a data point F1-602 on graph F1-600 of FIG. 15. If the percentage decay point is set to ten percent of the original value, the percent decay point is at data point F1-604, which is about 0.086 mA/cm². In other words, the percentage decay point may be determined by applying a pre-defined percentage to the original value, which is value of the electrical charge when the RF source is switched off and the system is returning to an equilibrium state. In an embodiment, the percentage is empirically determined. In an embodiment, instead of employing a percentage decay point to determine the end of the data interval, the peak of a first derivative of the data collected for each RF burst may be calculated.

At a next step E-506, the algorithm may determine the ion saturation interval, which is the data subset between the original value and a second decay point. As discussed herein, the ion saturation interval refers to the region of the current-voltage (IV) curve at which the probe potential is sufficiently negative with respect to the floating potential such that the electron flux to the probe is negligible. In this region the current to the probe increases slowly and linearly with increasingly negative potential. In addition, the ion saturation interval is the regime at which the bias voltage is sufficiently negative with respect to the floating potential such that the probe will collect all the available ions in the system. In other words, the collected current "saturates" as the bias voltage is raised sufficiently high. Also, as discussed herein, the "available ions" refers to the flux of ions impinging upon the sheath boundary, which may enlarge as the bias voltage is further increased.

In other words, the ion saturation interval is the interval from data points F1-602 and F1-606 of FIG. 15. In an embodiment, the second decay point may be determined by taking a percentage of the original value (i.e., data point F1-602). In an example, if the second decay point is about 95 percent of the original value, the second decay point is about 0.81 mA/cm² (i.e., data point F1-606). Hence, the ion saturation interval is from the original value (data point F1-602) to the second decay point (data point F1-606). Note that the second decay point is between the original value (data point F1-602) and the percentage decay point (data point F1-604). Similar to the percentage decay point, the second decay point may also be based on a pre-defined threshold, in an embodiment. In an embodiment, the percentage is empirically determined.

Once the ion saturation interval has been determined, at a next step E-508, the slope (s) and the ion saturation ($i_0$) may be estimated. As aforementioned, the slope (s) and the ion saturation ($i_0$) are two of the four seed values that may be applied to a mathematical model (Equation 2 below) to determine the parameters that characterize a plasma. In an example, die slope (s) may be determined by performing linear regression. In another embodiment, the algorithm may also determine the ion saturation ($i_0$) by taking the average of the data values between data points F1-602 and F1-606.

At a next step E-510, the algorithm may determine the inflection point, which is the point at which the first derivative changes sign. In an embodiment, the inflection point may be calculated by identifying the minimal value of the first derivative of the current values between the percentage decay point and the second decay point. To illustrate, FIG. 17 shows the first derivative of the values between a percentage decay point (F3-664) and an original point (F3-662) of a current signal F3-660. The inflection point is the minimal data point of the first derivative (F3-670), which has a value of −0.012 mA/cm² and an index value of 226 (as shown by data point F3-666). To determine the inflection value, the index value is mapped to current signal plot F3-660. In this example, when the index value of the first derivative is mapped to current signal F3-660, the inflection value is 0.4714 mA/cm², as shown by data point F3-668.

In an embodiment, the relevancy range is defined as the range between the original value and the inflection point. Additionally or alternatively, a percent decay threshold may be set (e.g., at 35 percent) instead of calculating the inflection point. In an example, using the percent decay point of 35 percent, which may be empirically determined, the relevancy range may fall between points F1-602 and F1-604 of FIG. 15.

$$T_e = \text{abs}\left(\frac{I_{meas}(t)}{\left(\frac{dI_{meas}}{dV_{meas}}\right)}\right) = \text{abs}\left(\frac{I_{meas}(t)}{\left(\frac{dI_{meas}}{dt}\right)\left(\frac{dt}{dV_{meas}(t)}\right)}\right) \quad \text{[Equation 1]}$$

TABLE 1

Parameters defined

| Parameters | Variable name |
| --- | --- |
| $I_{meas}$ | Current measured |
| $V_{meas}$ | Voltage measured |

TABLE 1-continued

| Parameters | Variable name |
|---|---|
| t | Current time |
| $T_e$ | Electron temperature |

With the inflection point identified, the electron temperature may be estimated, at a next step E-512. The electron temperature may be estimated by employing Equation 1 above. The current and voltage data utilized to calculate the electron temperature is within the transition interval, which is usually when a probe is drawing less current than the ion saturation current. In an embodiment, the time at which the current and voltage data is measured may correspond with the inflection point. Alternatively, the inflection point of the current-voltage (I-V) curve may also be employed. Since the electron temperature is a ratio of a first derivative (as determined in calculating the percentage decay point) of the data collected for an RF burst at a time corresponding to tire inflection point on the current-voltage curve, the computational overhead that may be required to generate the number is minimal.

At a next step E-514, the algorithm may determine the floating voltage potential. Since the floating voltage potential is determined based on the voltage data collected, the floating voltage potential may be determined without first having to determine the values as calculated in steps E-504-E-512. Those skilled in the art are aware that floating voltage potential is the electrical potential at which the probe floats after the external capacitor has fully discharged. Typically, the floating voltage potential may be determined by looking at the signal that occurs right before the next RF burst. However, due to the possibility of polymer buildup causing distortion, erroneous data (i.e., noise) may be collected; thus, the floating voltage potential may be calculated by averaging the voltage values collected toward the end of the collection period. In an embodiment, the floating voltage potential may be calculated from data point F2-652 (the data point at which the voltage first reaches its floating potential) to data point F2-654 (the data point just right before the next RF burst), as shown in FIG. F2. In another embodiment, the floating voltage potential may be based on the voltage values within a window F2-656, which is located between data points F2-652 and F2-654, as shown in FIG. 16. In an embodiment, window F2-656 may be of any size as long as the window begins before the prior pulse has decayed more than 99 percent and ends when the next pulse begins. In one embodiment, the floating voltage potential may be determined from a window that provides an average value with a low standard deviation (error).

As can be appreciated from the foregoing, the methods for determining the relevancy range and tire seed values account for anomalies that may occur in the current, voltage and/or current-voltage (TV) curves. In an example, polymer buildup may occur at the end of an RF burst. However, by applying the aforementioned algorithms, the relevancy range and the seed values are impervious to unexpected artifacts that may occur during processing.

Once the relevancy range has been determined and the seed values have been calculated, at a next step E-516, the current values may be plotted against the voltage values and curve-fitting may be applied to generate graph F4-680 of FIG. 18. In an example, a non-linear curve fit, such as Levenberg-Marquardt algorithm, may be applied to perform the curve-fitting.

By generating a curve-fitting graph and applying the seed values to the mathematical model, such as Equation 2 below, the four parameters that may be employed to characterize the plasma may be determined.

$$I = I_0 \left\{ 1 - s*(V - V_f) - \exp\left[\frac{(V - V_f)}{T_e}\right] \right\} \quad \text{[Equation 2]}$$

TABLE 2

| Parameters | Variable name |
|---|---|
| I | Current |
| $I_0$ | Ion saturation |
| S | Slope |
| V | Voltage |
| $V_f$ | Floating voltage potential |
| $T_e$ | Electron temperature |

As can be appreciated from one or more embodiments of the present invention, an automated method for characterizing plasma during plasma processing is provided. By determining a relevancy range and a set of seed values, plasma characterization may occur without having to process thousands or millions of data points that are usually collected after a single RF burst. The automated method transforms a previously tedious and manual process into an automatic task that may be performed quickly and efficiently. With data analysis significantly shortened from a few minutes (or even a few hours) to a few milliseconds, plasma characterization may be performed during plasma processing instead of being a post-production process. Thus, relevant data may provide insights into the current plasma environment, thereby enabling recipe and/or tool adjustment to occur and waste to be minimized.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. Also, it is intended that the following appended claims be interpreted as including all such alterations, permutations, and equivalents as fall within the true spirit and scope of the present invention.

What is claimed is:

1. A method for characterizing a deposited film on a substrate within a processing chamber of a plasma processing system during substrate processing, comprising:
    determining a voltage-current characteristic for a probe head, wherein a measuring capacitor is set at a first capacitance value;
    applying a radio frequency (RF) train to said probe head, thereby causing said measuring capacitor to be charged, wherein said measuring capacitor is set at a second capacitance value, said second capacitance value being greater than said first capacitance value;

providing an initial resistance value for said deposited film and an initial capacitance value for said deposited film;

employing said initial resistance value, said initial capacitance value, and said voltage-current characteristic to generate a first simulated voltage-time curve;

determining a first measured voltage-time curve, said first measured voltage-time curve representing a potential drop across said deposited film for one RF train; and comparing said first simulated voltage-time curve to said first measured voltage-time curve, wherein if a difference between said first simulated voltage-time curve and said first measured voltage-time curve is less than a predefined threshold, employing said initial resistance value and said initial capacitance for characterizing said deposited film.

2. The method of claim 1 further including if said difference between said first simulated voltage-time curve and said first measured voltage-time curve is greater than said predefined threshold, applying a non-linear least square curve algorithm to generate a second resistance value and a second capacitance value;

employing said second resistance value, said second capacitance value, and said voltage-current characteristic to generate a second simulated voltage-time curve; and determining a second measured voltage-time curve; and comparing said second simulated voltage-time curve to said second measured voltage-time curve, wherein
  if a difference between said second simulated voltage-time curve and said second measured voltage-time curve is less than said predefined threshold, employing said second resistance value and said second capacitance for characterizing said deposited film, and
  if said difference between said second simulated voltage-time curve and said second measured voltage-time curve is greater than said predefined threshold, applying said non-linear least square curve algorithm to generate a third resistance value and a third capacitance value.

3. The method of claim 2 further including calculating a simulated voltage-time curve and a measured voltage-time curve and comparing said simulated voltage-time curve against said measured voltage-time curve until a difference between said simulated voltage-time curve and said measured voltage-time curve is less than said predefined threshold.

4. The method of claim 3 wherein said voltage-current characteristic is generated by
  measuring potential across said measuring capacitor to determine a potential rate of change, and
  measuring current across said measuring capacitor to determine a rate of capacitor current discharge.

5. The method of claim 4 wherein said initial resistance value and said initial capacitance value are empirically calculated.

6. The method of claim 4 wherein said initial resistance value and said initial capacitance value are theoretically determined.

7. The method of claim 4 wherein a resistance value of said deposited film is related to chemical composition of said deposited film, said resistance value is a function of film resistivity, distance, and cross-area of said probe head.

8. The method of claim 4 wherein a capacitance value of said deposited film is related to at least thickness of said deposited film and relative dielectric permittivity, said capacitance value being a function of permittivity of free space, relative permittivity of film dielectric material, surface area of said probe head, and film thickness.

9. The method of claim 1 wherein said measuring capacitor is a switchable capacitor arrangement with multiple capacitors, wherein each capacitor of said multiple capacitors has a different capacitance value.

10. An article of manufacture comprising a program storage medium having computer readable code embodied therein, said computer readable code being configured for characterizing a deposited film on a substrate within a processing chamber of a plasma processing system during substrate processing, comprising:

code for determining a voltage-current characteristic for a probe head, wherein a measuring capacitor is set at a first capacitance value;

code for applying a radio frequency (RF) train to said probe head, thereby causing said measuring capacitor to be charged, wherein said measuring capacitor is set at a second capacitance value, said second capacitance value being greater than said first capacitance value;

code for providing an initial resistance value for said deposited film and an initial capacitance value for said deposited film;

code for employing said initial resistance value, said initial capacitance value, and said voltage-current characteristic to generate a first simulated voltage-time curve;

code for determining a first measured voltage-time curve, said first measured voltage-time curve representing a potential drop across said deposited film for one RF train; and code for comparing said first simulated voltage-time curve to said first measured voltage-time curve, wherein if a difference between said first simulated voltage-time curve and said first measured voltage-time curve is less than a predefined threshold, code for employing said initial resistance value and said initial capacitance for characterizing said deposited film.

11. The article of manufacture of claim 10 further including if said difference between said first simulated voltage-time curve and said first measured voltage-time curve is greater than said predefined threshold, code for applying a non-linear-least square curve algorithm to generate a second resistance value and a second capacitance value;

code for employing said second resistance value, said second capacitance value, and said voltage-current characteristic to generate a second simulated voltage-time curve; and code for determining a second measured voltage-time curve; and code for comparing said second simulated voltage-time curve to said second measured voltage-time curve, wherein
  if a difference between said second simulated voltage-time curve and said second measured voltage-time curve is less than said predefined threshold, code for employing said second resistance value and said second capacitance for characterizing said deposited film, and
  if said difference between said second simulated voltage-time curve and said second measured voltage-time curve is greater than said predefined threshold, code for applying said non-linear least square curve algorithm to generate a third resistance value and a third capacitance value.

12. The article of manufacture of claim 11 further including code for calculating a simulated voltage-time curve and a measured voltage-time curve and code for comparing said simulated voltage-time curve against said measured voltage-time curve until a difference between said simulated voltage-rime curve and said measured voltage-time curve is less than said predefined threshold.

13. The article of manufacture of claim 12 wherein said voltage-current characteristic is generated by
 code for measuring potential across said measuring capacitor to determine a potential rate of change, and
 code for measuring current across said measuring capacitor to determine a rate of capacitor current discharge.

14. The article of manufacture of claim 13 wherein said initial resistance value and said initial capacitance value are empirically calculated.

15. The article of manufacture of claim 13 wherein a resistance value of said deposited film is related to chemical composition of said deposited film, said resistance value is a function of film resistivity, distance, and cross-area of said probe head.

16. The article of manufacture of claim 13 wherein a capacitance value of said deposited film is related to at least thickness of said deposited film and relative dielectric permittivity, said capacitance value being a function of permittivity of free space, relative permittivity of film dielectric material, surface area of said probe head, and film thickness.

17. The article of manufacture of claim 10 wherein said measuring capacitor is a switchable capacitor arrangement with multiple capacitors, wherein each capacitor of said multiple capacitors has a different capacitance value.

18. An arrangement for characterizing a deposited film within a processing chamber of a plasma processing system during substrate processing, comprising:
 a probe arrangement, wherein said probe arrangement is configured for at least measuring one plasma processing parameter, said probe arrangement including
  a plasma-facing sensor made of a conductive material, and
  a measuring capacitor configured to be switched between two or more values, wherein said plasma-facing sensor is coupled to a first plate of said measuring capacitor;
 a radio frequency (RF) voltage source, said RF voltage source being coupled to a second plate of said measuring capacitor, wherein said RF voltage source is configured to provide RF oscillation trains to said plasma-facing sensor;
 a resistor-capacitor circuit, wherein said resistor-capacitor circuit includes a resistor in parallel with a capacitor;
 a current measurement device, said current measurement device being disposed in series between said measuring capacitor and said RF voltage source, wherein said current measurement device is configured to detect said measuring capacitor current discharge rate;
 a voltage measurement device disposed between said first plate of said measuring capacitor and ground, wherein said voltage measurement device is configured for measuring potential of said plasma-facing sensor; and
 a signal processor, wherein said signal processor is configured for analyzing said current discharge rate and said potential of said plasma-facing sensor to determine a voltage-current characteristic for said plasma-facing sensor.

19. The arrangement of claim 18 wherein said plasma-facing sensor is disposed on a chamber wall of said processing chamber and is substantially co-planar with said chamber wall.

20. The arrangement of claim 18 wherein said plasma-facing sensor is a radio frequency-biased (RFB) capacitively-coupled electrostatic (CCE) probe head.

* * * * *